US011955995B2

(12) United States Patent
Guilford et al.

(10) Patent No.: US 11,955,995 B2
(45) Date of Patent: Apr. 9, 2024

(54) APPARATUS AND METHOD FOR TWO-STAGE LOSSLESS DATA COMPRESSION, AND TWO-STAGE LOSSLESS DATA DECOMPRESSION

(71) Applicant: Intel Corporation, Santa Clara, CA (US)

(72) Inventors: James Guilford, Northborough, MA (US); Vinodh Gopal, Westborough, MA (US); Daniel Cutter, Maynard, MA (US); Kirk Yap, Westborough, MA (US); Wajdi Feghali, Boston, MA (US); George Powley, Northborough, MA (US)

(73) Assignee: Intel Corporation, Santa Clara, CA (US)

( * ) Notice: Subject to any disclaimer, the term of this patent is extended or adjusted under 35 U.S.C. 154(b) by 725 days.

(21) Appl. No.: 16/872,144

(22) Filed: May 11, 2020

(65) Prior Publication Data
US 2021/0351790 A1    Nov. 11, 2021

(51) Int. Cl.
*H03M 7/30* (2006.01)
*H03M 7/46* (2006.01)

(52) U.S. Cl.
CPC ......... *H03M 7/607* (2013.01); *H03M 7/3066* (2013.01); *H03M 7/3084* (2013.01); *H03M 7/46* (2013.01)

(58) Field of Classification Search
CPC .. H03M 7/607; H03M 7/6076; H03M 7/6088; H03M 7/70
(Continued)

(56) References Cited

U.S. PATENT DOCUMENTS 7,233,266 B2 * 6/2007 Sasakura ............. H03M 7/3084
341/51
8,666,186 B1 * 3/2014 Rasche .................. G06V 10/30
382/244

(Continued)

OTHER PUBLICATIONS

Deutsch, P., "DEFLATE Compressed Data Format Specification version 1.3", Network Working Group, Request for Comments: 1951, May 1996, 15 pages.
(Continued)

*Primary Examiner* — Peguy Jean Pierre
(74) *Attorney, Agent, or Firm* — Nicholson De Vos Webster & Elliott LLP

(57) ABSTRACT

A lossless data compressor of an aspect includes a first lossless data compressor circuitry coupled to receive input data. The first lossless data compressor circuitry is to apply a first lossless data compression approach to compress the input data to generate intermediate compressed data. The apparatus also includes a second lossless data compressor circuitry coupled with the first lossless data compressor circuitry to receive the intermediate compressed data. The second lossless data compressor circuitry is to apply a second lossless data compression approach to compress at
(Continued)

least some of the intermediate compressed data to generate compressed data. The second lossless data compression approach different than the first lossless data compression approach. Lossless data decompressors are also disclosed, as are methods of lossless data compression and decompression.

17 Claims, 9 Drawing Sheets

(58) Field of Classification Search
USPC .................................. 341/65, 67, 50, 59, 51
See application file for complete search history.

(56) References Cited

U.S. PATENT DOCUMENTS

| | | | | |
|---|---|---|---|---|
| 10,911,064 | B1* | 2/2021 | Xie | ........................ H03M 7/6011 |
| 2002/0064232 | A1* | 5/2002 | Fukuhara | ................ H04N 19/64 |
| | | | | 375/240.26 |
| 2004/0210668 | A1* | 10/2004 | Garakani | ................. H04L 69/04 |
| | | | | 709/236 |
| 2007/0109153 | A1 | 5/2007 | Ma et al. | |
| 2016/0124683 | A1* | 5/2016 | Zhang | ................... G06F 3/0616 |
| | | | | 711/154 |
| 2016/0380649 | A1* | 12/2016 | Henry | ...................... H03M 7/42 |
| | | | | 341/51 |
| 2018/0183900 | A1 | 6/2018 | Guilford et al. | |
| 2018/0239801 | A1 | 8/2018 | Mosur et al. | |
| 2019/0251418 | A1* | 8/2019 | Nakanishi | .............. G06N 3/045 |
| 2020/0067523 | A1 | 2/2020 | Sofia et al. | |

OTHER PUBLICATIONS

Github, "linux/lzo1x_compress.c at master", torvalds/linux, Available Online at <https://github.com/torvalds/linux/blob/master/lib/lzo/lzo1x_compress.c>, Retrieved on Jan. 19, 2021, 9 pages.

Gopal et al., "High Performance DEFLATE Compression on Intel(registered) Architecture Processors", White Paper, Intel Corporation, Nov. 2011, 15 pages.

Intel, "Intel(registered) Xeon(registered) Scalable Platform", Product Brief, 2017, 14 pages.

Intel, "Integrated Cryptographic and Compression Accelerators on Intel(registered) Architecture Platforms", Solution Brief, Intel(registered) QuickAssist Technology, 2013, 5 pages.

Intel, "Intel(registered) QuickAssist Technology Compression API Reference", Reference No. 330686-009, 2019, 112 pages.

Intel, "Intel(registered) QuickAssist Technology", API Programmer's Guide, Document No. 330864-007US, Feb. 2020, 73 pages.

Wilson et al., "The Case for Compressed Caching in Virtual Memory Systems", USENIX Annual Technical Conference, 1999, 16 pages.

Andres Lagar-Cavilla et al., Software-Defined Far Memory in Warehouse-Scale Computers, Apr. 13, 2019, 1-14.

Lefty Leverenz, LanguageManual ORC—Apache Hive, Jun. 17, 2017, 1-4.

* cited by examiner

APPARATUS AND METHOD FOR TWO-STAGE LOSSLESS DATA COMPRESSION, AND TWO-STAGE LOSSLESS DATA DECOMPRESSION

BACKGROUND

Technical Field

Embodiments described herein generally relate to data processing. In particular, embodiments described herein generally relate to data compression and decompression.

Background Information

Data compression and decompression are widely used in the fields of computer, network, and telecommunications technology. Data compression generally involves encoding, converting, compressing, or otherwise processing input data (e.g., data files, data structures, data streams, or other information) to generate compressed data having a smaller size (e.g., fewer bits) than the input data. Data decompression generally involves converting, decompressing, or otherwise processing the compressed data to regenerate the original uncompressed data.

One common reason to perform such data compression is to reduce the number of bits that electronic devices need to store, transmit, or otherwise accommodate. For example, data may be compressed before it is stored to memory or storage in order to reduce the number of bits that need to be stored. As another example, data may be compressed before it is transmitted with a transmission device (e.g., a wireless transceiver or network interface card), or conveyed via a transmission medium (e.g., cable, wireless channel, communication link, etc.) to reduce the number of bits that the transmission device needs to transmit, and the transmission medium needs to convey.

BRIEF DESCRIPTION OF THE DRAWINGS

The invention may best be understood by referring to the following description and accompanying drawings that are used to illustrate embodiments. In the drawings.

DETAILED DESCRIPTION OF EMBODIMENTS

Disclosed herein are embodiments of multi-stage data compressors, multi-stage data decompressors, multi-stage data compression methods, multi-stage data decompression methods, and devices having the multi-stage data compressors and/or the multi-stage data decompressors. In the following description, numerous specific details are set forth (e.g., specific compression and decompression approaches, combinations of compression and decompression approaches, implementation details, system-level configurations, sequences of operation, and the like). However, it is to be appreciated that embodiments may be practiced without these specific details. In other instances, well-known circuits, structures, and techniques have not been shown in detail in order to avoid obscuring the understanding of the description.

I. Limitations of Using a Single Compression and/or Decompression Algorithm or Other Approach Various compression and decompression algorithms, schemes, or other approaches are known in the arts to compress data. These approaches generally differ from one another based on various factors, such as, for example, the level of compression (e.g., compression ratio) achievable, the speed of performing the compression and/or decompression, the complexity of performing the compression and/or decompression, the resources needed to perform the compression and/or decompression, whether and how much information is lost, and the like. Some data compression approaches are lossless whereas others are lossy. Lossless compression compresses the data by eliminating redundancy (e.g., statistical redundancy) substantially without information loss. Lossy compression generally also compresses the data by eliminating redundancy but also allows certain information (e.g., less important and/or unnecessary information) to be eliminated.

Generally, there are trade-offs among these various factors. A given compression and/or decompression approach may trade certain of these factors in favor of other of these factors. For example, achieving higher levels of compression generally comes at the expense of one or more of reduced speed of performing the compression, increased complexity of performing the compression, and/or increased resources to perform the compression. As another example, achieving faster speeds of performing the compression generally comes at the expense of one or more of lower levels of compression, increased complexity of performing the compression, and/or increased resources to perform the compression. Work has been done to improve and perfect certain of the more common data compression algorithms or approaches. However, for a given data compression approach, there generally are limits or points of diminishing return on the level at which one of these factors may be further improved, even at the expense of other of these factors.

II. Two-Stage Lossless Data Compressors and Decompressors

Figure 1:
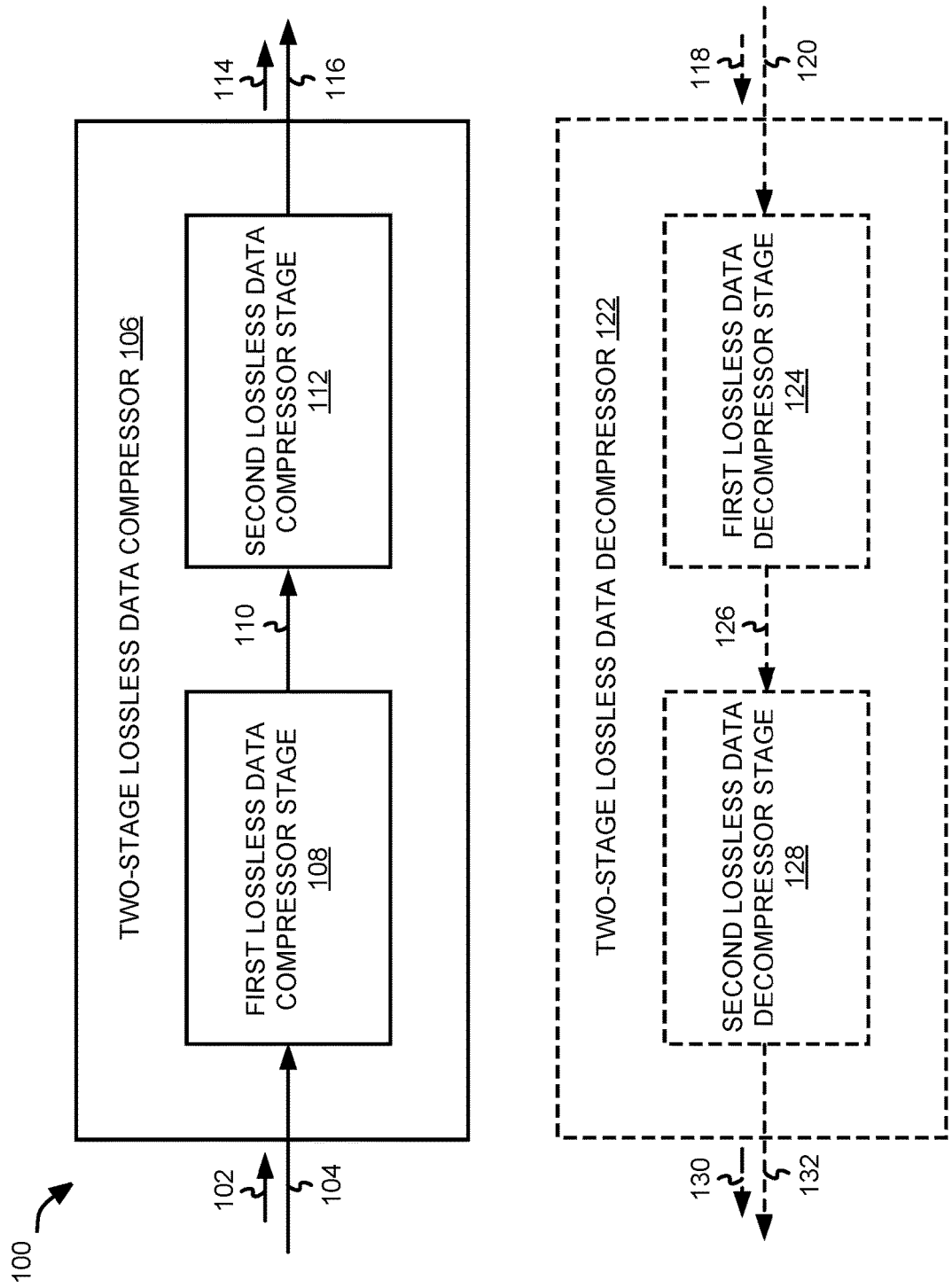
FIG. 1 is a block diagram of an apparatus including an embodiment of a two-stage lossless data compressor, and an embodiment of a two-stage lossless data decompressor.

FIG. 1 is a block diagram of an embodiment of an apparatus 100 (e.g., a system-on-chip (SoC), a chip, a die, an integrated circuit, or the like) including a two-stage lossless data compressor 106, and an embodiment of a two-stage lossless data decompressor 122. Compressors and decompressors are often employed together, but this is not always the case. It is to be appreciated that other embodiments pertain to the two-stage lossless data compressor alone, and still other embodiments pertain to the two-stage lossless data decompressor alone. For simplicity, the two-stage lossless data compressor may also be referred to simply as the compressor, and the two-stage lossless data decompressor may also be referred to simply as the decompressor. The compressor is sometimes referred to in the arts as an encoder, and the decompressor is sometimes referred to in the arts as a decoder.

The compressor 106 includes two lossless data compressor stages, namely a first lossless data compressor stage 108, and a second lossless data compressor stage 112. For simplicity, the first lossless data compressor stage may also be referred to simply as the first compressor stage, and the second lossless data compressor stage may also be referred to simply as the second compressor stage.

The first compressor stage 108 and second compressor stage 112 may be connected or otherwise coupled stagewise and/or serially one after the other. The first compressor stage may represent the initial or first data compressor portion, unit, block logic, circuit, or other stage of the compressor. The first compressor stage may be coupled with a compressor input interconnect 104 to receive an input data 102. By way of example, the input data may potentially be received from a processor core, an input and/or output (I/O) device, or other type of device capable of sourcing the input data.

The first compressor stage may be designed based on, and may be operative to use or perform or apply, a first lossless data compression algorithm, scheme, or other approach. In some embodiments, the first compressor stage 108 may include at least some data compression circuitry, logic, or hardware to implement the first lossless data compression approach. During operation, the first compressor stage may compress the input data by using and/or performing the first lossless data compression approach to generate an intermediate compressed data. Since the intermediate compressed data will be further compressed (e.g., by the second compressor stage), it may also be referred to herein as "partially" compressed data, even though it may have been "fully" compressed according to the first lossless data compression approach. The first compressor stage may output the intermediate or partially compressed data on compressor first stage output conductors 110.

The second lossless data compressor stage 112 may represent a subsequent or second data compressor portion, unit, block logic, circuit, or other stage of the compressor. The second compressor stage may be connected or otherwise coupled stagewise after and/or serially after the first compressor stage. For example, the second compressor stage may be coupled with the compressor first stage output conductors 110 to receive the intermediate or partially compressed data from the first compressor stage.

The second compressor stage may be designed based on, and may be operative to use or perform or apply, a second lossless data compression algorithm, scheme, or other approach that is different than the first lossless data compression approach of the first compressor stage. In some embodiments, the second compressor stage 112 may include at least some data compression circuitry, logic, or hardware to implement the second lossless data compression approach. During operation, the second compressor stage may compress the intermediate or partially compressed data by using and/or performing the second lossless data compression approach to generate a compressed data 114. The compressed data may have a smaller size than the intermediate or partially compressed data. The second compressor stage may be coupled with a compressor output interconnect 116 to output or provide the compressed data. By way of example, the compressed data may potentially be provided to a memory, a storage device, a transmitter device, a transmission medium, or the like, depending upon the implementation.

Referring again to FIG. 1, the two-stage lossless data decompressor 122 includes two lossless data decompressor stages, namely a first lossless data decompressor stage 124, and a second lossless data decompressor stage 128. For simplicity, these may also be referred to simply as the first decompressor stage, and the second decompressor stage.

The first and second decompressor stages may be connected or otherwise coupled stagewise and/or serially one after the other. The first decompressor stage may represent the initial or first data decompressor portion, unit, block logic, circuit, or other stage of the decompressor. The first decompressor stage may be coupled with a decompressor input interconnect 120 to receive a compressed data 118. By way of example, the compressed data may potentially be received from a memory, a storage device, a transmitter device, a transmission medium, or other type of device capable of sourcing the compressed data.

The first decompressor stage may be designed based on, and may be operative to use or perform or apply, the second lossless data decompression algorithm, scheme, or other approach. The same types used for the second lossless data compressor are suitable, and if the compressor and decompressor are used together, the same second approach should be used. In some embodiments, the first decompressor stage 124 may include at least some data decompression circuitry, logic, or hardware to implement the second lossless data decompression approach. During operation, the first decompressor stage may decompress the compressed data by using and/or performing the second lossless data decompression approach to generate an intermediate compressed data. Since the intermediate decompressed data will be further decompressed (e.g., by the second decompressor stage), it may also be referred to herein as "partially" decompressed data, even though it may have been "fully" decompressed according to the second lossless data compression algorithm or other scheme. The first compressor stage may output the intermediate or partially decompressed data on decompressor first stage output conductors 126.

The second decompressor stage may represent a subsequent or second data decompressor portion, unit, block logic, circuit, or other stage of the decompressor. The second decompressor stage may be connected or otherwise coupled stagewise after and/or serially after the first decompressor stage. For example, the second decompressor stage may be coupled with the output of the first decompressor stage and/or the decompressor first stage output conductors 126 to receive the intermediate or partially decompressed data.

The second decompressor stage may be designed based on, and may be operative to use or perform or apply, the first lossless data compression algorithm, scheme, or other approach. The same types used for the first lossless data compressor are suitable, and if the compressor and decompressor are used together, the same second approach should be used. In some embodiments, the second decompressor stage 128 may include at least some data decompression circuitry, logic, or hardware to implement the first lossless data decompression approach.

During operation, the second decompressor stage may decompress the intermediate or partially decompressed data by using and/or performing the first lossless data decompression approach to generate an uncompressed data 130 (e.g., regenerate the input data 102). The second decompressor stage may be coupled with a decompressor output interconnect 132 to output or provide the uncompressed data. By way of example, the uncompressed data may potentially be provided to a processor core, an input and/or output (I/O) device, or other type of device, depending upon the implementation.

The compressor 106 and the decompressor 122 may each be implemented in hardware (e.g., integrated circuitry, transistors, diodes, capacitors, other circuit elements, etc.), firmware (e.g., persistent or non-volatile memory storing microcode, microinstructions, or other lower-level (e.g., circuit-level) instructions), software (e.g., higher-level instructions stored in memory), or a combination thereof (e.g., hardware potentially combined with one or more of firmware and/or software). In some embodiments, the compressor and decompressor may each be implemented at least partly in hardware, or primarily in hardware, potentially with a lesser amount of firmware and/or software. In some embodiments, the compressor and the decompressor may each be disposed, integrated, or included within at least one integrated circuit or semiconductor die.

In some embodiments, the first and second stages of the compressor may each optionally be included within the same pipeline. In some embodiments, the first and second stages of the decompressor may each optionally be included within the same pipeline. In such embodiments, the data output from the first stage of the compressor (or decompressor) may be connected or otherwise coupled directly (e.g., by circuitry or hardware) to the input of the second stage of the compressor (or decompressor) without the data output from the first stage needing to first be sent to memory. This may help to avoid increased memory bandwidth and latency.

The compressor and the decompressor are shown in FIG. 1 as being entirely separate from one another, with no overlapping portion or resources (e.g., of logic, circuitry, hardware, etc.). Keeping the compressor and the decompressor entirely separate from one another may tend to help increase concurrent throughput, since resources are not shared by the compressor and decompressor, and therefore they do not compete for use of the shared resources. In other embodiments, the compressor and the decompressor may share at least some logic, circuitry, storage, or other resources. For example, the compressor and the decompressor may optionally be at least partly included within the same pipeline and may share at least part of the resources of the pipeline. In some cases, at least some or even much of the compression resources (e.g., gates) may be reused for decompression. In some cases, the compressor and the decompressor may optionally share a buffer or other storage (e.g., an LLD (literals and length/distance) queue or other history buffer). Such sharing of resources may help reduce the overall size (e.g., die area), manufacturing cost, and power consumption. As used herein, references to the compressor and the decompressor encompass them either being entirely separate or having a shared or overlapping portion or resources.

III. Two-Stage Lossless Data Compression and Decompression Methods

Figure 2:
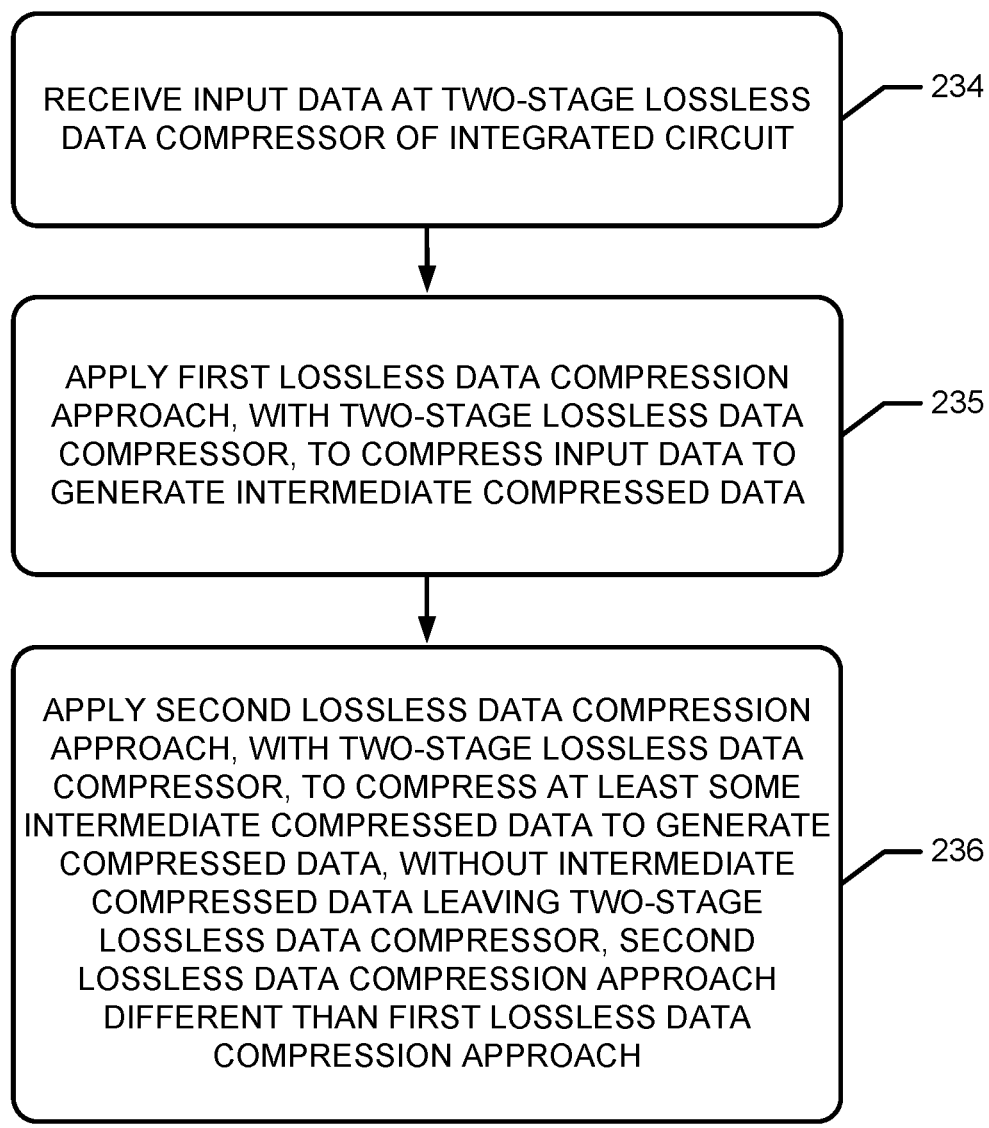
FIG. 2 is a block flow diagram of an embodiment of a two-stage lossless data compression method.

FIG. 2 is a block flow diagram of an embodiment of a two-stage lossless data compression method 201. In various embodiments, the method may be performed by a two-stage lossless data compressor, integrated circuit (e.g., system-on-a-chip (SoC)), or other apparatus. In some embodiments, the method 201 may be performed by and/or with the two-stage lossless data compressor 106 of FIG. 1. The components, features, and specific optional details described herein for the two-stage lossless data compressor 106 may also optionally apply to the method 201. Alternatively, the method may be performed by and/or within a similar or different two-stage lossless data compressor, integrated circuit, or other apparatus. Moreover, the two-stage lossless data compressor 106 may perform methods the same as, similar to, or different than the method 201.

The method includes receiving input data at a two-stage lossless data compressor of an integrated circuit, at block 234. A first lossless data compression approach is applied, with the two-stage lossless data compressor, to compress the input data to generate intermediate compressed data, at block 235. A second lossless data compression approach is applied, with the two-stage lossless data compressor, to compress the intermediate compressed data to generate compressed data, without the intermediate compressed data leaving the two-stage lossless data compressor, at block 236. The second lossless data compression approach different than the first lossless data compression approach.

Figure 3:
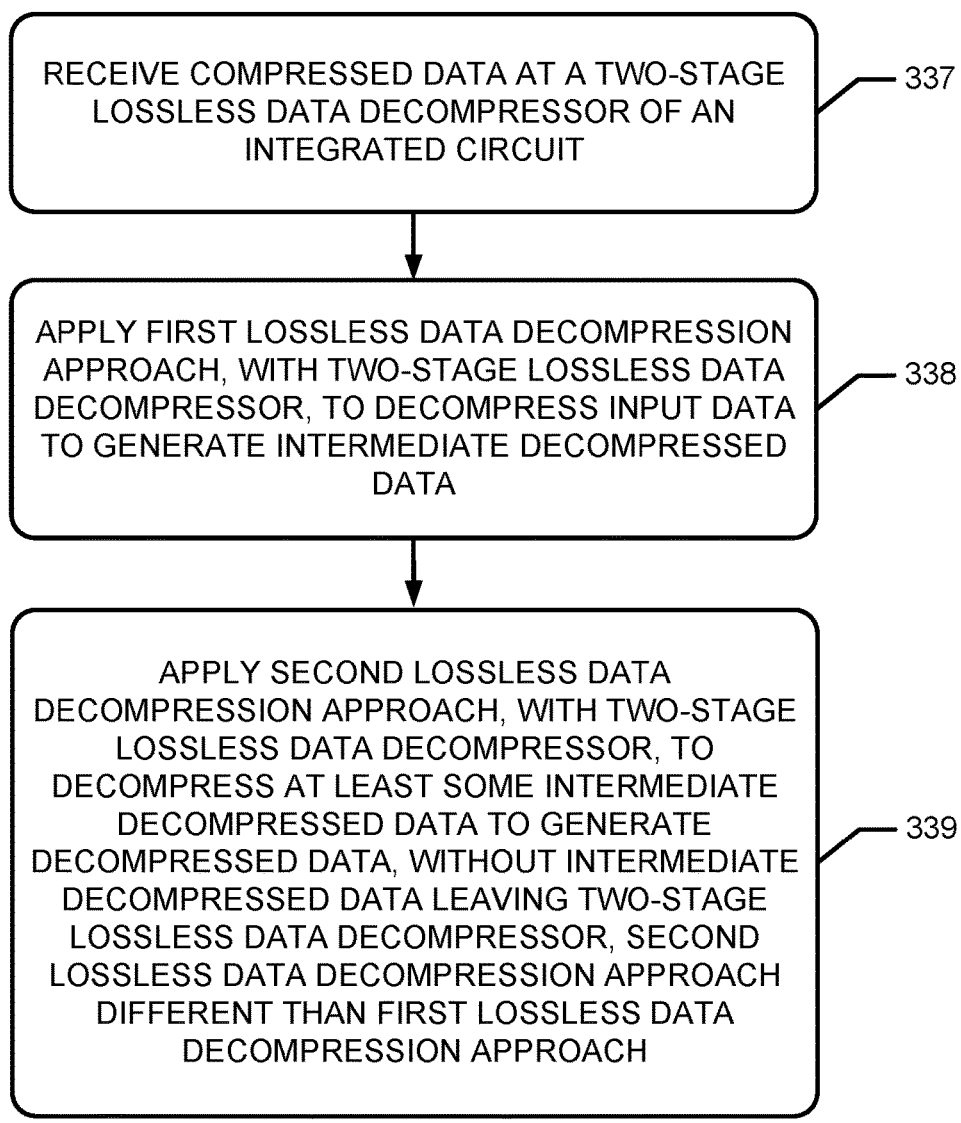
FIG. 3 is a block flow diagram of an embodiment of a two-stage lossless data decompression method.

FIG. 3 is a block flow diagram of an embodiment of a two-stage lossless data decompression method 303. In various embodiments, the method may be performed by a two-stage lossless data decompressor, integrated circuit (e.g., system-on-chip (SoC)), or other apparatus. In some embodiments, the method 303 may be performed by and/or with the two-stage lossless data decompressor 122 of FIG. 1. The components, features, and specific optional details described herein for the two-stage lossless data decompressor 122 may also optionally apply to the method 303. Alternatively, the method 303 may be performed by and/or within a similar or different two-stage lossless data decompressor, integrated circuit, or other apparatus. Moreover, the two-stage lossless data decompressor 122 may perform methods the same as, similar to, or different than the method 303.

The method includes receiving compressed data at a two-stage lossless data decompressor of an integrated circuit, at block 337. A first lossless data decompression approach is applied, with the two-stage lossless data decompressor, to decompress the input data to generate intermediate decompressed data, at block 338. A second lossless data decompression approach is applied, with the two-stage lossless data decompressor, to decompress the intermediate decompressed data to generate decompressed data, at block 339. The intermediate decompressed data does not leave the two-stage lossless data decompressor. The second lossless data decompression approach is different than the first lossless data decompression approach.

IV. Examples of Using Two Different Compression and/or Decompression Approaches to Improve Performance The two different compression and/or decompression approaches may tend to offer certain potential advantages for certain implementations, or at least be useful, over just one single compression and/or decompression approach. In various embodiments, the two different approaches may be chosen to improve one or more of the level of compression achievable, the time needed to perform the compression and/or decompression, the complexity of performing the compression and/or decompression, the resources needed to perform compression and/or decompression, or another such factor, over what would be achieved using just the better of the two approaches for that factor.

As one specific example, in some embodiments, the two different approaches may be chosen to decrease the overall time needed to perform the compression and/or decompression using both approaches, over the time needed to perform the compression and/or decompression achievable using only the slower or more time consuming one of the two different approaches. In some embodiments, the overall maximum compression ratio achievable using the two different approaches may be maintained at least substantially the same as, or in some cases even greater than, that achievable using only one of the two different approaches able to achieve the highest compression ratio.

The time needed to perform compression using many commonly used high-compression algorithms or other approaches generally increases with increasing amounts or sizes of the input data. For example, this is the case for most if not all dictionary coder based approaches. As used herein, dictionary coder based compression approaches represent lossless data compression approaches that operate by identifying matches between data to be compressed and data in a data structure (conceptualized as a "dictionary") maintained by the compressor. When the compressor finds such a match, it introduces a reference to the position of the matching data in the data structure. By way of example, Deflate based approaches are dictionary coder approaches with substantially constant compression speeds or rates per unit amount of input data compressed, such that the time needed to perform compression increases roughly linearly with increasing amounts or sizes of the input data (e.g., compressing twice as much input data takes about twice as long). Other examples of such other dictionary coder based approaches include, but are not limited to, Broth, Zstandard, Lempel-Ziv (LZ) approaches, LZ77 approaches, LZ78 approaches, LZW (Lempel-Ziv-Welch) approaches, LZO (Lempel-Ziv-Oberhumer) approaches, and. Similarly, the time to compress data with other common approaches, besides just dictionary coder based approaches, such as bzip2 and other Burrows-Wheeler transform approaches, also typically increases when more input data is compressed.

In some embodiments, a relatively slower and relatively higher compression ratio algorithm or other approach, may be selected as the second approach of the second compressor stage (e.g., second compressor stage 112), and a relatively faster, and optionally relatively lower compression ratio, algorithm or other approach may be selected for the first approach of a first compressor stage (e.g., first compressor stage 108). The "slower," "faster," "higher," and "lower," are relative terms (i.e., the first and second approaches relative to one another (i.e., the higher compression ratio approach has a higher compression ratio than the lower compression ratio approach, and the slower approach is slower than the faster approach). To some extent the speeds and compression ratios of the approaches may be dependent upon the particular data being processed, however to be clear, as used herein, these relative terms refer to the case on average when the approaches are applied to a sufficiently large amount (e.g., at least 100 KB) of representative data. For example, for memory type data this may be a large set of pages (e.g., at least 25) being swapped out from a Linux paging sub-system. As another example, for spare matrix type data, this may include many "typical" sparse matrixes envisioned for the particular application. However, these relative terms are often expected to apply to many or most other types of data with the possible exception of certain corner cases that may work particularly well for one approach more than others.

A wide variety of different types of compression approaches are generally suitable for the second approach, as long as they are relatively slower than the chosen first approach, take more time to compress when more data is being compressed, and provide compression ratios sufficiently high for the particular intended implementation. Examples of suitable approaches for the second approach include, but are not limited to, Deflate, Broth, Zstandard, bzip2, Lempel-Ziv (LZ) approaches, LZ77 approaches, LZ78 approaches, LZW (Lempel-Ziv-Welch) approaches, LZO (Lempel-Ziv-Oberhumer) approaches, and Burrows-Wheeler transform approaches, as well as new releases of these approaches, future versions of these approaches, derivatives of these approaches, approaches similar to these approaches, and other approaches as long as they meet the relative criteria of being relatively faster and relatively higher compression ratio than the chosen first approach. In one specific example embodiment, a Deflate based approach is used for the second approach, although the scope of the invention is not so limited.

Most compression approaches significantly faster than the chosen second approach should be generally suitable for the first approach. Specific examples of suitable approaches for the first approach typically include, but are not limited to, those based on zero compress, run length encoding (RLE), FPC (frequent pattern compression), Wilson-Kaplan direct-mapped (WKdm), as well as new releases of these approaches, future versions of these approaches, derivatives of these approaches, and approaches similar to these approaches, and other approaches, as long as they are faster than the chosen second approach.

In some embodiments, the first approach may optionally be selected based on a type of the data to be compressed. For example, as will be explained further below, a zero compress based approach may be selected for memory data, sparse matrices, or the like. In one specific example embodiment, a zero compress based approach is used for the first approach, although the scope of the invention is not so limited. Advantageously, the zero compress approach may tend to work better than other compression approaches for certain types of data, such as, for example, arrays of small integers, sparse 8-bit and 16-bit matrices or other data structures, and other data with a good proportion of relatively short (e.g., 1-3 byte) runs of zeroes (e.g., two zero bytes, two non-zero bytes, two zero bytes, etc.). Other types of memory data often have this attribute. For data with such relatively short runs of zeroes, the zero compress approach tends to provide better compression than RLE.

The first compressor stage may apply the first relatively faster compression approach to input data to generate the intermediate compressed data, and then the second compressor stage may apply the second relatively slower and relatively higher compression ratio approach, to the intermediate compressed data to generate the compressed data. Because the first compression approach is faster that the second compression approach, the overall data compression speed or latency is not significantly increased by the performance of the first compression approach (e.g., the time needed to perform the first approach is hidden by the time needed to perform the second approach). Advantageously, since any data compression achieved by the first compression approach reduces the amount of the intermediate compressed data that the second compression approach needs to compress, the overall time needed to perform the second compression approach may decrease, thereby decreasing the overall time needed to perform the compression using both approaches over the time that would be needed to compress the full set of input data by using only the slower of the two compression approaches (i.e., the second compression approach). Also, since the second approach is still used, typically the overall maximum compression ratio achievable using the two different approaches may be maintained at least substantially not lower than (meaning herein not more than 5% lower than), or in some cases even greater than, that achievable using only one of the two different compression approaches able to achieve the highest compression ratio (i.e., the second compression approach).

To further illustrate certain concepts, consider the following detailed example embodiment, in which a zero compress approach is used by a first compressor stage (e.g., first compressor stage 108), and a Deflate approach is used by a second compressor stage (e.g., second compressor stage 112), to compress typical memory data (e.g., typical memory pages). On average, the zero compress approach is typically able to compress memory data (e.g., memory pages) to about half their original size on average (e.g., some pages are compressed very little, whereas other pages are compressed a lot, such that often the average compression is by about half). This in turn may decrease the time needed to compress the data with the Deflate approach by about half (e.g., since the speed or rate of the Deflate approach per unit data compressed is roughly constant, the time needed to compress data decreases roughly linearly with decreasing amount of the data). The faster zero compress approach can run ahead of the slower Deflate approach, so the overall speed may be dominated by the Deflate approach. The compression ratio is typically not substantially lower than, or even slightly higher (e.g., several percent higher), when both the zero compress and Deflate approaches are used, relative to just using the Deflate compression approach alone. Commonly, the decompression speed using both the zero decompress and Deflate decompress approaches is also typically slightly faster (e.g., several percent faster) than just using the Deflate compression approach. Since decompression is generally sequential in nature, and it is therefore often challenging to improve single-stream performance, even decompression speed increases in this range may be significant.

As another specific example, in other embodiments, the two different compression approaches may be chosen to increase the overall level of compression achievable using both approaches, over the level of compression achievable by using only the highest compression ratio one of the two different approaches alone. For example, a zero compress approach may be selected for the first compressor stage, and a Deflate approach may be selected for the second compressor stage to compress memory type data (e.g., memory pages). Typically, such a combination of approaches can increase the overall level of compression achievable, over the level of compression achievable by using only the highest compression ratio one of the two different approaches alone (e.g., the Deflate approach). Choosing algorithms that are sufficiently different from one another in their basic design may be helpful to achieve higher overall levels of compression.

V. Detailed Example Two-Stage Lossless Data Compressors and Decompressors

Figure 4:
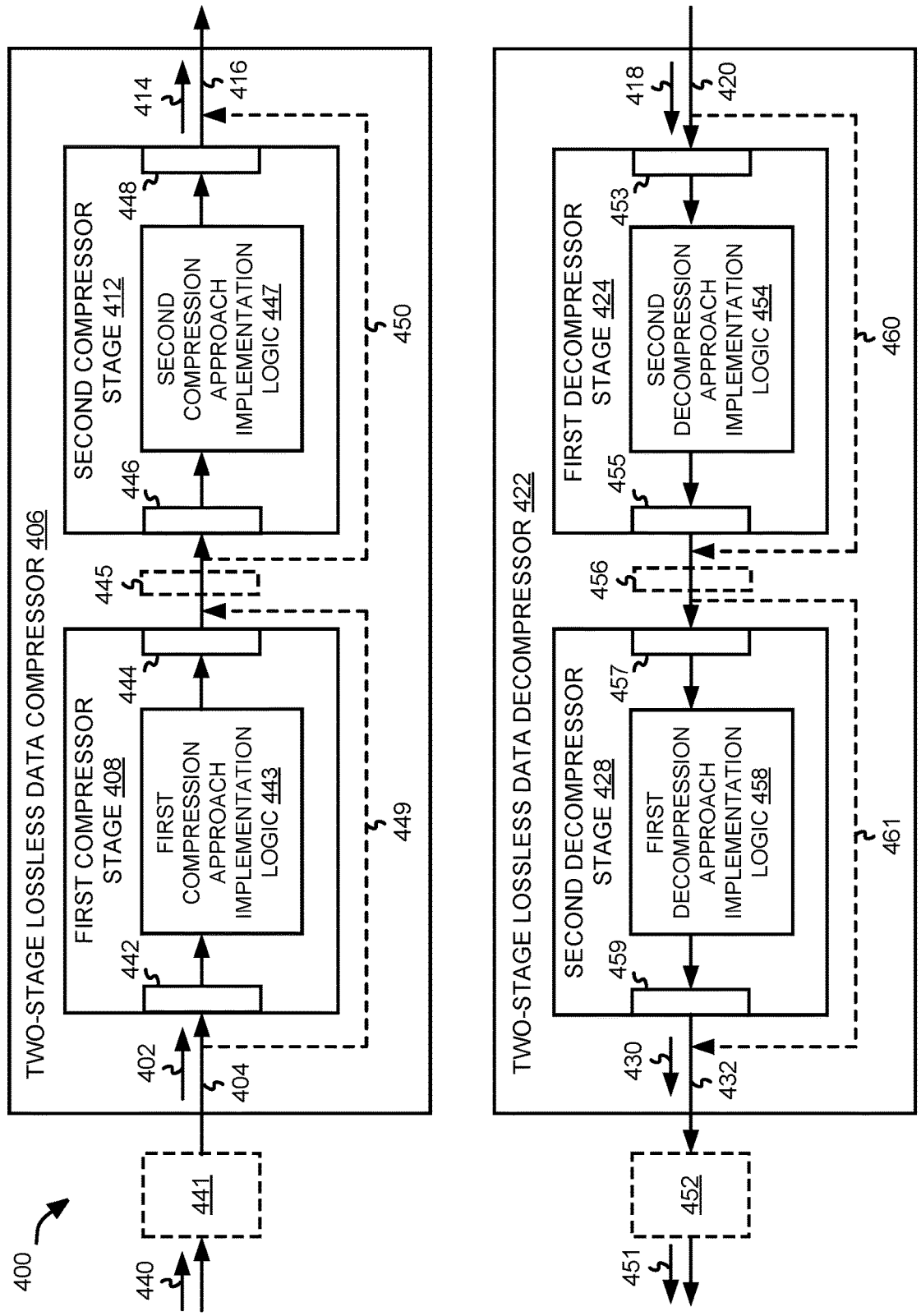
FIG. 4 is a block diagram of an apparatus including a detailed example embodiment of a two-stage lossless data compressor, and a detailed example embodiment of an optional two-stage lossless data decompressor.

FIG. 4 is a block diagram of an apparatus 400 (e.g., a system-on-chip (SoC), a chip, a die, an integrated circuit, or the like) including a detailed example embodiment of two-stage lossless data compressor 406, and a detailed example embodiment of an optional two-stage lossless data decompressor 422. The compressor includes a first lossless data compressor stage 408 and a second lossless data compressor stage 412. The decompressor includes a first lossless data decompressor stage 424 and a second lossless data decompressor stage 428. Aside from the different and/or additional aspects mentioned below, these components may optionally have some or all the characteristics described above for the correspondingly named components of FIG. 1. To avoid obscuring the description, the different and/or additional characteristics will primarily be described without repeating all the characteristics that may optionally be the same or similar to those already described for FIG. 1.

In some embodiments, a first optional error protection unit 441 (e.g., error protection circuitry or other logic) may optionally be coupled at an input to, and used along with, the compressor 406. The error protection unit is optional not required. The first error protection unit is coupled to receive input data 441. The first error protection unit may be operative to generate error protection data (e.g., error detection data and/or error correction data) from the received input data. Examples of suitable error protection units include, but are not limited to, cyclic redundancy check (CRC) units, hash circuits or units, cryptographic units, and other error detection and/or error correction units. By way of example, a CRC unit may be operative to generate a check value or error detection code by applying a CRC algorithm to the input data. The check value may represent an example of error detection data that may be used to detect subsequently introduced errors into the input data, as well as error correction data that may be used to correct a certain amount of error subsequently introduced into the data. The error protection unit may provide error protected input data 402, including the input data and the check value or other error protection data, on a compressor input interconnect 404.

A first compressor stage 408 has a first stage input structure 442 coupled with the compressor input interconnect 404 to receive the input data or optionally error protected input data. By way of example, the structure 442 may be a bus endpoint, an interconnect endpoint, one or more ports, an interface, or the like. A first lossless data compression approach implementation logic 443 is coupled with the first stage input structure to receive the input data or optionally error protected input data. The first lossless data compression approach implementation logic may be operative to compress the data it receives based on a first lossless data compression approach to generate intermediate compressed data. The first lossless data compression approach implementation logic may include at least some specific or particular compression circuitry, hardware, firmware (e.g., microcode stored in non-volatile memory), or other logic, to implement the first lossless data compression approach. In one specific embodiment, the implementation logic shown in FIG. 6 may optionally be used for a zero compress approach. A first stage output structure 444 (e.g., a bus endpoint, an interconnect endpoint, one or more ports, an interface, etc.) is coupled with the first compression approach implementation logic to receive the intermediate compressed data, and output the intermediate or partially compressed data on compressor first stage output conductors 410.

In some embodiments, an optional buffer, queue, or other storage 445 may be coupled between the first compressor stage and the second compressor stage, although this is not required. Examples of suitable storage include, but are not limited to, those used in the arts for temporary registers, reorder buffers, caches, and the like. The optional storage may temporarily store portions of the intermediate compressed data prior to it being further compressed by the second compressor stage. Depending upon the implementation, a small amount of storage ranging from a few bytes to a few hundred bytes, or optionally more, may be included.

A second compressor stage 412 has a second stage input structure 446 (e.g., a bus endpoint, an interconnect endpoint, one or more ports, an interface, etc.) coupled with the first stage output conductors 410 to receive the intermediate compressed data. In some embodiments, rather than the first stage output structure 444 and the second stage input structure 446 needing formal interfaces, bus endpoints, an interface, or the like, first and second stages may be more directly or closely coupled through conductors, conductive lines, latches, or the like. A second lossless data compression approach implementation logic 447 is coupled with the second stage input structure to receive the intermediate compressed data. The second lossless data compression approach implementation logic may be operative to compress the intermediate compressed data based on a second lossless data compression approach (different than the first lossless data compression approach) to generate compressed data. The second lossless data compression approach implementation logic may include at least some specific or particular compression circuitry, hardware, firmware (e.g., microcode stored in non-volatile memory), or other logic, to implement the second lossless data compression approach. In one specific embodiment, the implementation logic shown in FIG. 8 may optionally be used for a Deflate compress approach. A second stage output structure 448 (e.g., a bus endpoint, an interconnect endpoint, one or more ports, an interface, etc.) is coupled with the second compression approach implementation logic to receive the compressed data, and output the compressed data 414 on compressor output interconnect 416.

Referring now to the decompressor 422, a first decompressor stage 424 has a first stage input structure 453 (e.g., a bus endpoint, an interconnect endpoint, one or more ports, an interface, etc.) coupled with a decompressor input interconnect 420 to receive a compressed data 418. A second lossless data decompression approach implementation logic 454 is coupled with the first stage input structure 453 to receive the compressed data. The second lossless data decompression approach implementation logic may be operative to decompress the compressed data based on the second lossless data decompression approach (the same as that used by the second compressor stage) to generate intermediate decompressed data. The second lossless data decompression approach implementation logic may include at least some specific or particular decompression circuitry, hardware, firmware (e.g., microcode stored in non-volatile memory), or other logic, to implement the second lossless data decompression approach. In one specific embodiment, the implementation logic shown in FIG. 9 may optionally be used for a Deflate decompress approach. A first stage output structure 455 (e.g., a bus endpoint, an interconnect endpoint, one or more ports, an interface, etc.) is coupled with the second lossless data decompression approach implementation logic to receive the intermediate decompressed data, and output the intermediate or partially decompressed data on decompressor first stage output conductors 426.

In some embodiments, an optional buffer, queue, or other storage 456 may be coupled between the first decompressor stage and the second decompressor stage, although this is not required. The types of storage previously mentioned for the storage 445 are generally suitable. The optional storage may temporarily store portions of the intermediate decompressed data prior to it being further decompressed by the second decompressor stage. Depending upon the implementation, a small amount of storage ranging from a few tens to a few thousands of bytes, or optionally more, may be included.

A second decompressor stage 428 has a second stage input structure 457 (e.g., a bus endpoint, an interconnect endpoint, one or more ports, an interface, etc.) coupled with the first stage output conductors 426 to receive the intermediate decompressed data. In some embodiments, rather than the first stage output structure 444 and the second stage input structure 446 needing formal interfaces, bus endpoints, or the like, first and second stages may be more directly or closely coupled through conductors, conductive lines, latches, or the like. A first lossless data decompression approach implementation logic 458 is coupled with the second stage input structure to receive the intermediate decompressed data. The first lossless data decompression approach implementation logic may be operative to decompress the data it receives based on the first lossless data decompression approach (the same one as used by the first compressor stage and different than used by the first decompression stage) to generate intermediate compressed data. The first lossless data decompression approach implementation logic may include at least some specific or particular decompression circuitry, hardware, firmware (e.g., microcode stored in non-volatile memory), or other logic, to implement the first lossless data decompression approach. In one specific embodiment, the implementation logic shown in FIG. 7 may optionally be used for a zero decompress approach. A second stage output structure 459 (e.g., a bus endpoint, an interconnect endpoint, one or more ports, an interface, etc.) is coupled with the first decompression approach implementation logic to receive the decompressed data, and output the decompressed data 430 on decompressor output interconnect 432.

In some embodiments, a second optional error protection unit 452 (e.g., error protection circuitry or other logic) may optionally be coupled to receive the decompressed data 430. The same types of protection units previously described for the first optional error protection unit 441 are suitable (e.g., a CRC unit or circuitry, hash circuitry, etc.). Whereas the compressor performs the error protection at the input to the compressor, the decompressor performs the error protection at the output of the decompressor. The second optional error protection unit may use a check value, error correction code, hash value, cryptographic value, or other error protection data provided along with the received compressed data 418 to perform error detection, correction, or other protection on the compressed data. The error protection unit 452 may use the decompressed data 430 to regenerate the same type of error protection data and compare it with the one received in the received compressed data 418. If the received and regenerated error protection data do not match, then an error has occurred, and error correction or other corrective action may be taken to protect against data corruption. Otherwise, the received and regenerated data matching is indicative that no error has occurred.

In some embodiments, an optional compressor first bypass 449 may optionally be provided to allow at least some or all of the input data 402 to bypass the first compressor stage and/or an optional compressor second bypass 450 may optionally be provided to allow at least some or all of the intermediate compressed data to bypass the second compressor stage. In some embodiments, an optional decompressor first bypass 460 may optionally be provided to allow at least some or all of the compressed data 418 to bypass the first decompressor stage and/or an optional decompressor second bypass 461 may optionally be provided to allow at least some or all of the intermediate compressed data to bypass the second decompressor stage. Each of the bypasses may generally represent one or more lines, wires, interconnects, buses, or other conductive paths. By way of example, such bypasses may optionally be used to allow one of the two compression approaches to be used along rather than both together. As another example, part of the intermediate compressed data produced by the first compressor stage (e.g., a bitmask produced by a zero compress approach as described further below) may optionally either bypass or not bypass the second compressor stage via the compressor second bypass 450. This may help to allow different trade-offs between compression and/or decompression time versus achieved compression ratio. These bypasses are optional not required.

Figure 5:
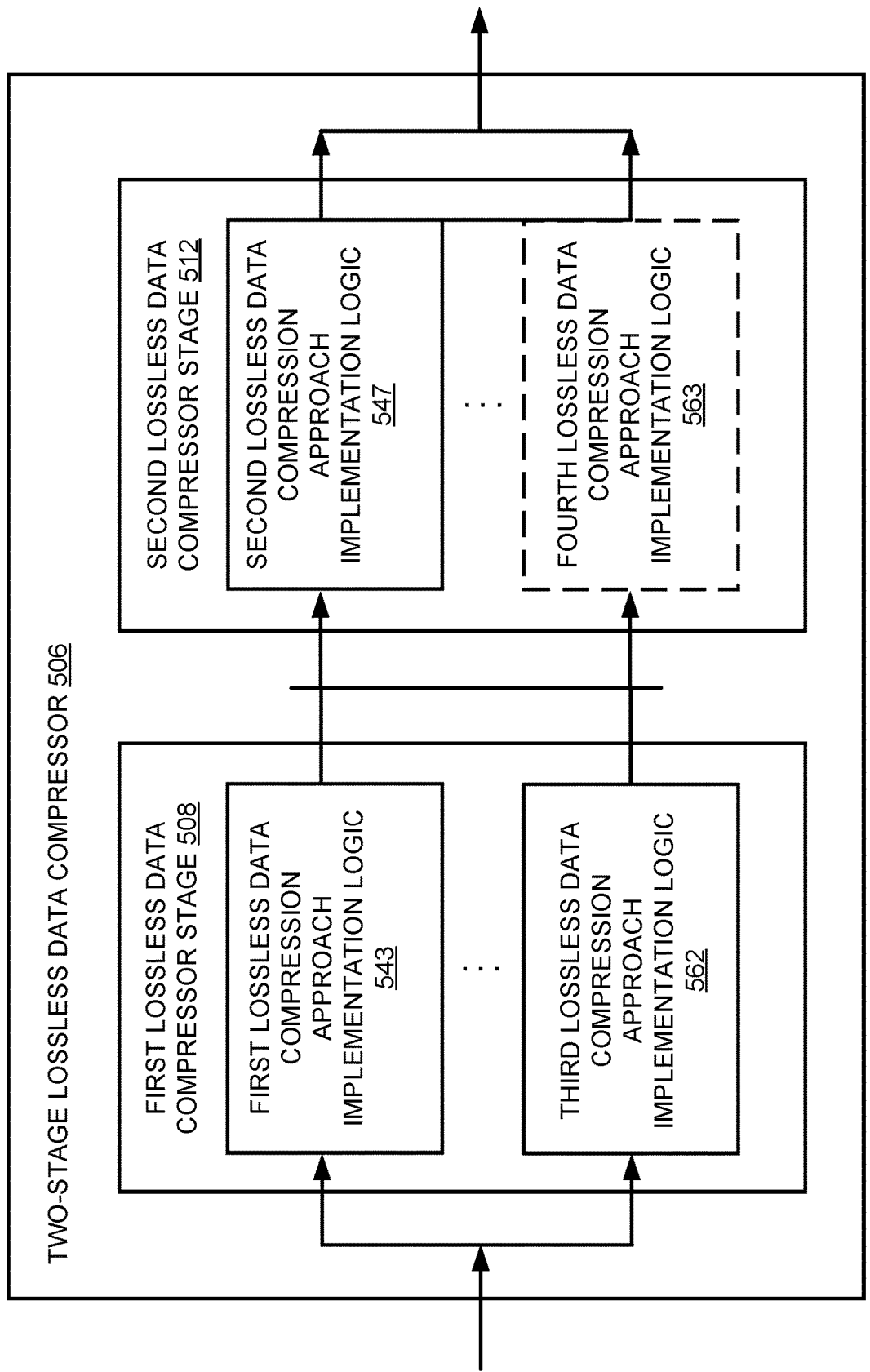
FIG. 5 is a block diagram of a two-state lossless data compressor having a first lossless data compressor stage to implement at least two different lossless data compression algorithms or other approaches, and a second lossless data compressor stage to implement at least two different lossless data compression algorithms or other approaches.

FIG. 5 is a block diagram of a two-state lossless data compressor 506 having a first lossless data compressor stage 508 to implement at least two different lossless data compression algorithms or other approaches, and a second lossless data compressor stage 512 to implement at least two different lossless data compression algorithms or other approaches. The first lossless data compressor stage includes at least a first lossless data compression approach implementation logic 543 (e.g., any of those described above for the first compressor stage 108), a third, different lossless data compression approach implementation logic 562 (e.g., any other of those described above for the first compressor stage 108), and optionally one or more additional ones (e.g., any other still different ones described above for the first compressor stage 108). The second lossless data compressor stage includes at least a second lossless data compression approach implementation logic 547 (e.g., any of those described above for the second compressor stage 112), optionally a fourth, different lossless data compression approach implementation logic 563 although this is not required (any of those described above for the second compressor stage 112), and optionally one or more additional ones (e.g., any other still different ones described above for the second compressor stage 112). The implementation logic may optionally include circuitry or other logic. Any one of the implementation logics may be selected for the first compressor stage, and any one of the implementation logics may be selected for the second compressor stage, to provide various combinations of different lossless data compression approaches.

VI. Two-Stage Lossless Data Compressors and Decompressors

Certain types of data tend to have a large proportion of zeroes. By way of example, this may tend to be the case for matrixes or other data structures consisting of mainly small integers, where the most significant bits are all zeroes (e.g., the example 32-bit doubleword small integer 00000000000000000000000010111101), sparse matrices or other sparsely populated data structures (e.g., sparse artificial intelligence data structures) where many of the positions are unpopulated and are filled with zeroes, other sparsely populated or heavily zeroed data sets, and the like. Partly due to this, memory pages on average tend to have a relatively large proportion of zeroes. One data compression approach that tends to be well suited for compressing such data is the zero compress algorithm.

Figure 6:
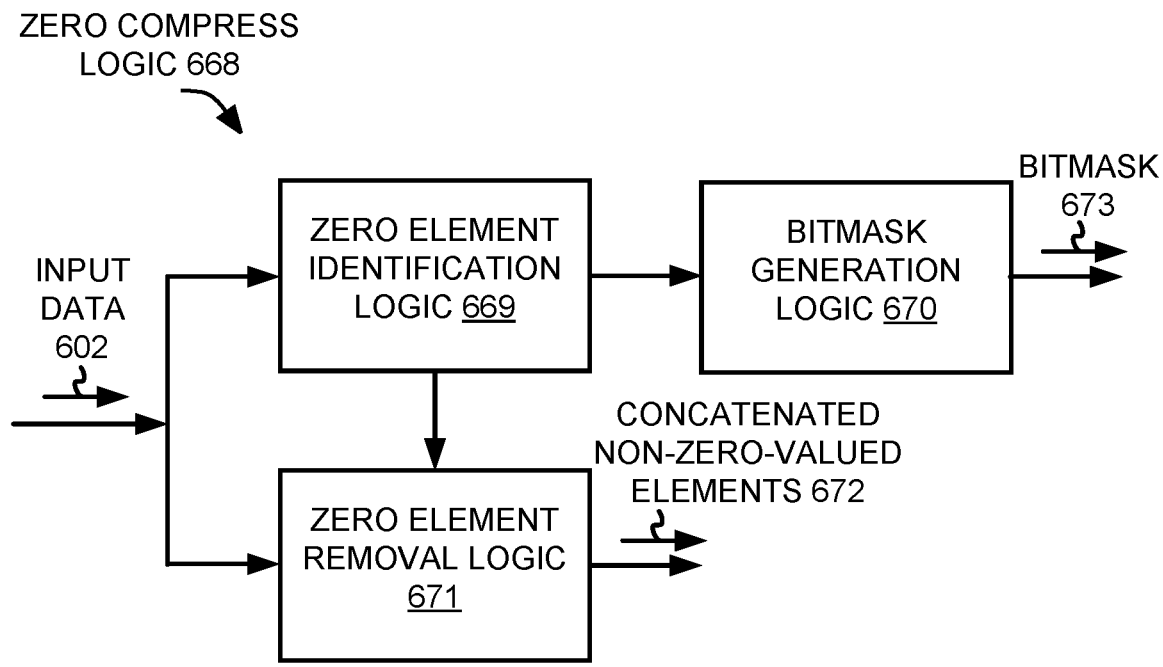
FIG. 6 is a block diagram of an example embodiment of zero compress logic to compress input data according to a zero compress approach.

FIG. 6 is a block diagram of an example embodiment of zero compress logic 668 to compress input data according to a zero compress approach. In some embodiments, the zero compress logic may optionally be included in the first lossless data compressor stage 108 of FIG. 1 and/or the first compressor stage 408 of FIG. 4, although the scope of the invention is not so limited.

The zero compress logic includes zero element identification logic 669 coupled to receive input data 602. The input data may be of a certain block size. Very small block sizes may tend to have certain drawbacks (e.g., decreasing decompress speed/rate and/or compression ratio achievable through two stage data compression (e.g., through padding overheads and/or mixing bitmask bits in a fine grained manner with data in a way that may tend to hinder the second compressor stage in identifying longer matching sequences)). Similarly, very large block sizes may tend to have certain drawbacks (e.g., adding additional buffering costs). In some embodiments, the block size may be configured to range from around 64-bytes to around 1024-bytes, although the scope of the invention is not limited to any known size.

The zero element identification logic 669 may be operative to analyze or examine the input data to determine which data elements are zero valued data elements (e.g., zero valued bytes 00000000) and which are not (e.g., non-zero-valued bytes 10110111, 01010101, etc.). The zero compress approach may be used with different data element sizes (e.g., 8-bit bytes, 16-bit words, 32-bit doublewords, 64-bit quadwords). By way of example, the zero element identification logic may potentially include comparison circuitry or other logic to detect zero valued elements.

Bitmask generation logic 670 is coupled with the zero element identification logic to receive indications therefrom of the zero-valued elements. The bitmask generation logic may be operative to use these received indications to generate a bitmask 673. The bitmask may have one bit for each corresponding element of input data (e.g., a 128-bit bitmask for a 128-byte input data block). Each bit of the bitmask may have a first binary value (e.g., cleared to binary zero) to specify that the corresponding element is a zero-valued element, or a second different binary value (e.g., set to binary one) to specify that the corresponding element is a non-zero-valued element. The bits of the bitmask may correspond to the elements of the input data in same relative positions (e.g., bit-1 of the bitmask may correspond to element-1 of the input data, bit-2 may correspond to element-2, and so on). The bitmask generation logic may output the bitmask 673. By way of example, bitwise logical operation circuitry (e.g., logical AND gates, logical OR gates, etc.) may optionally be included to generate the bitmask.

Zero element removal logic 671 is coupled with the zero element identification logic to receive the indications therefrom of the zero-valued elements. The zero element removal logic may be operative to use these indications to generate a concatenated sequence of all the non-zero-valued elements 672. Each of these non-zero-valued elements may correspond to one of the bits of the second binary value (e.g., set to one) in the bitmask in the same relative position. To achieve compression, the identified zero-valued elements are omitted from the concatenated sequence of the non-zero-valued elements 672. No information is lost, since the positions of the zero-valued elements are already represented by the bits of the first value in the bitmask, and since all the zero-valued elements have a known or implicit value of zero at the particular data element size being used. By way of example, when a byte data element size is used, if the 5-byte input data is 11111111 00000000 11110000 00000000 00001111, then the bitmask 673 may be 10101, and the concatenated sequence of non-zero-valued elements 672 may be 11111111 11110000 00001111. Generally, the greater the proportion of zero-valued elements in the input data, the greater the compression ratio achievable by the zero compress approach.

The zero element removal logic may output the concatenated sequence of non-zero-valued elements 672, either appended to the bitmask 673, or separate from the bitmask. Together, the bitmask and the concatenated sequence of non-zero-valued elements represent the compressed data. In some embodiments, both the bitmask and the concatenated sequence of the non-zero-valued elements may optionally be compressed by the second compressor stage. This generally allows a greater amount of compression but with a longer compression time. In other embodiments, only one but not both the bitmask and the concatenated sequence of the non-zero-valued elements may optionally be compressed by the second compressor stage (e.g., commonly the concatenated sequence since it offers more compressibility). For example, one may bypass the second compressor stage (e.g., be conveyed along bypass 450). This generally allows a shorter compression time but achieves a greater amount of compression. Such ability to allow or not allow a portion of the compressed data from the first compressor stage to be further compressed by the second compressor stage may help to provide different trade-offs between compression time and compression amount. The same may apply to the decompression. Moreover, when both the bitmask and the concatenated sequence of the non-zero-valued elements are compressed, they may either be compressed together or separately.

Figure 7:
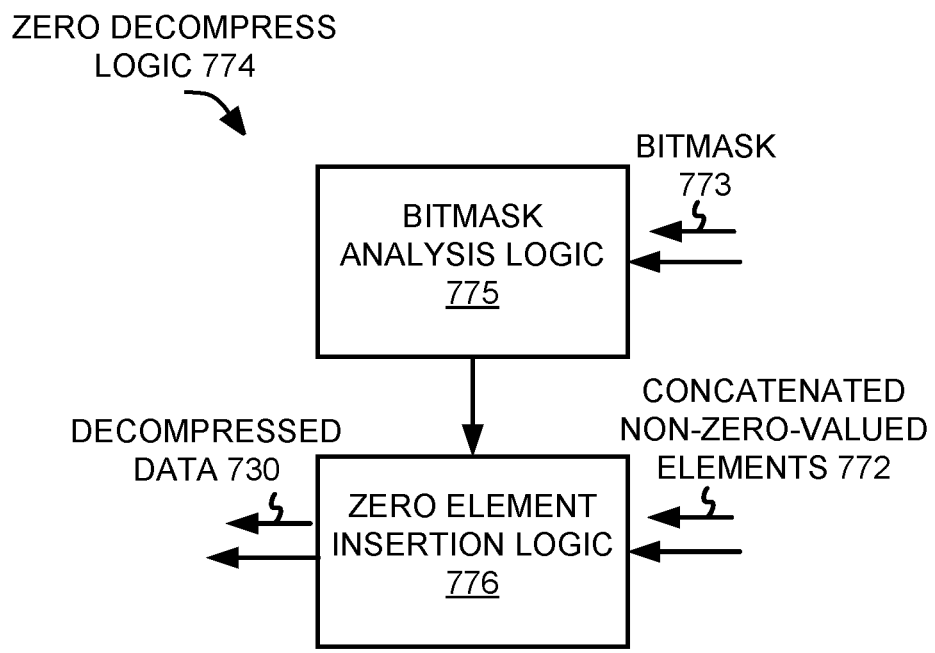
FIG. 7 is a block diagram of an example embodiment of zero decompress logic to decompress compressed data according to a zero decompress approach.

FIG. 7 is a block diagram of an example embodiment of zero decompress logic 774 to decompress compressed data according to a zero decompress approach. In some embodiments, the zero decompress logic may optionally be included in the first lossless data decompressor stage 112 of FIG. 1 and/or 412 of FIG. 4, although the scope of the invention is not so limited.

The zero decompress logic 774 may perform substantially a reversal of the operations performed by the zero compress logic 668 of FIG. 6. Bitmask analysis logic 775 may be coupled to receive a bitmask 773 (e.g., part of the compressed data), and may be operative to analyze or examine the bitmask to determine whether each bit specifies that the corresponding element of decompressed data is to be a zero-valued element or is to be a non-zero-valued element. As mentioned above, each bit of the bitmask may have the first binary value (e.g., be cleared to zero) to specify that the corresponding element is a zero-valued element, or the second different binary value (e.g., be set to one) to specify that the corresponding element is a non-zero-valued element. The bitmask analysis logic may output indications of this to zero element insertion logic 776.

The zero element insertion logic 776 is coupled to receive a concatenated sequence of the non-zero-valued elements 772 (e.g., part of the compressed data), and is coupled with the bitmask analysis logic 775 to receive the indications of zero-valued and non-zero-valued elements. The zero element insertion logic is operative to use these indications, and the concatenated sequence of the non-zero-valued elements, to generate uncompressed data 730. When a bit of the bitmask has the second binary value (e.g., set to one), then the corresponding non-zero-valued element is included at the appropriate position in the concatenated non-zero-valued elements 772. There is one element for each bit having the second binary value (e.g., set to one) in the bitmask, so each sequential bit having the second binary value (e.g., set to one) in the bitmask may be used to identify or select the corresponding next sequential non-zero-valued element. Conversely, when the bit of the bitmask has the first binary value (e.g., cleared to zero), then the corresponding zero-valued element is not included among the concatenated non-zero-valued element in the compressed data, but it's value is known to be or implicitly zero at the data element size being employed (i.e., 00000000 for bytes, 0000000000000000 for words, etc.). Correspondingly, the zero element insertion logic may insert zeroes of the data element size at the appropriate data element position in the concatenated non-zero-valued elements 772. By way of example, if the bitmask is 10101, and the concatenated sequence of non-zero-valued bytes is 11111111 11110000 00001111, then the following 5-byte decompressed data 730 may be generated 11111111 00000000 11110000 00000000 00001111, where the two zero-valued bytes have been inserted. The zero decompress logic may determine it has finished when it reaches the end of the concatenated non-zero-valued elements and finds bit of the second value in the bitmask that does not have a corresponding non-zero-valued element in the concatenated non-zero-valued elements. The zero element insertion logic may output the uncompressed data 730.

Other types of data and/or data sets may have other values besides zero as the most common value. For example, zero-valued elements may not be that common in English text data, whereas the value corresponding to the space character may be one of the most common values. Other types of data may similarly have another value as the most common value. It is contemplated that approaches analogous to the previously described zero-compress approach may be used for these other non-zero-valued, but most common valued, data element values. For example, an analogous approach may be used for the space character in English text data instead of zeroes. In some embodiments, a stage of a compressor or decompressor may optionally support a flexible programmer-specified value to be used analogously to the zero-valued elements in the previously described zero compress approach as the basis for compression or decompression (e.g., an API command used to invoke the data compression may have a parameter or operand to specify the value).

The zero compress approach, and others analogous to it based on other most common values, are relatively "lightweight" approaches that provide relatively fast data compression relative to other higher compression ratio approaches like Deflate and similar approaches. Although the amount of compression achievable by the zero compress approach depends upon the input data, for memory data or pages it is not uncommon for the zero compress approach to be able to compress the input data to about half its original size. In some embodiments, the zero compress approach, or other approaches analogous to zero compress but based on other most common values besides zero, may optionally be used as the first stage of a two-stage lossless data compressor to significantly reduce the amount of data (e.g., number of bits) that the second stage needs to compress (e.g., by about half).

Figure 8:
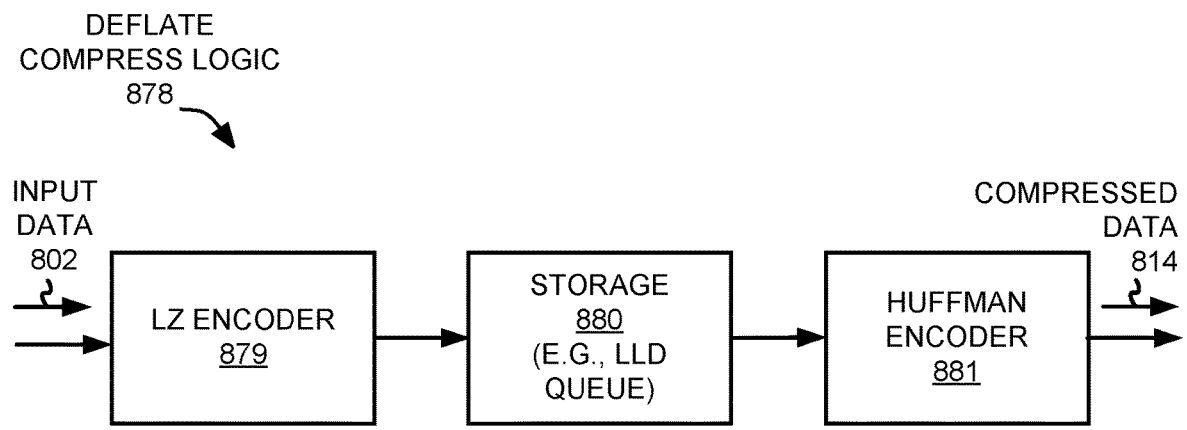
FIG. 8 is a block diagram of an example embodiment of Deflate compress logic to compress input data according to a Deflate approach.

FIG. 8 is a block diagram of an example embodiment of Deflate compress logic 878 to compress input data according to a Deflate approach. In some embodiments, the Deflate approach may be based on and/or consistent with the Deflate algorithm as described in Internet Engineering Task Force RFC1951: Deflate Compressed Data Format Specification version 1.32, although the scope of the invention is not so limited. Deflate based approaches are widely in the art, such as in utilities such as gzip, and libraries such as Zlib. In some embodiments, the Deflate compress logic may optionally be included in the second lossless data compressor stage 112 of FIG. 1 and/or the 412 of FIG. 4, although the scope of the invention is not so limited.

Data compression using Deflate is typically performed on a block-by-block basis. The Deflate compressed data format includes a series of blocks corresponding to successive blocks of the input data. The Deflate approach is able to store compressed output data of three different types: (1) a stored literal section; (2) a static Huffman compressed block using a pre-defined Huffman tree prescribed by the approach; and (3) a compressed block along with a supplied Huffman table.

The Deflate compress logic includes an LZ (Lempel-Ziv) encoder 879 (e.g., an LZ77 encoder) coupled to receive input data 802. The input data may be arranged in blocks of a flexible length. The LZ encoder may be operative to initially examine or analyze the input data to detect or identify matching repeated or duplicated strings (e.g., perform string matching). By way of example, comparison circuitry or other logic may be used to detect the matching strings. By way of example, the LZ77 encoder may include hash logic or circuitry, a hash table storage, and a history buffer storage to perform such string matching. Then, the LZ77 encoder may be operative to replace the identified matching strings with pointers, back references, or relative distance offsets representing the backward distance of the matching strings, and the length of the matching strings. By convention in Deflate, an encoded match to an earlier matching string may include an 8-bit length (e.g., able to identify a length between 3 to 258 bytes) and a 15-bit distance (e.g., able to identify a distance of between 1 to 32,768 bytes) to the beginning of the matching string. Matches may be made in the same or previous blocks of the input data if the distance is within a sliding window (e.g., the last 32 KB of uncompressed data decoded according to Deflate). The sliding window is often referred to as the history window or history table. By convention in Deflate, the matched strings may be limited in size to a maximum of 258 bytes in length, and substitution may only occur for strings of length greater than 3 bytes. If a matching string is not found for a byte, then the original value of the byte is retained in the compressed data as a so-called literal. The LZ encoder may output literals and length/distance data often referred to in the arts as symbols.

A queue or other storage 880 is coupled with an output of the LZ encoder to receive the literals and length/distance data, symbols, or output from the LZ encoder. The storage may be operative to queue or otherwise store the output. By way of example, the storage may serve as a so-called LLD (literals and length/distance) queue.

A Huffman encoder 881 is coupled with the storage 880 to receive the literals and length/distance data, symbols, or output of the LZ encoder. The Huffman encoder may be operative to replace symbols with new weighted symbols based on the frequency of use of the symbols. Each symbol or value (literals, length/distance) in the received data may be represented using a Huffman code. A compressed block can have either static Huffman codes (e.g., fixed codes defined in the standard) or dynamic Huffman codes. Each dynamic block consists of a pair of Huffman code trees. One tree is used for literals and lengths and another tree for distances. The trees describe the representation of the compressed data and the compressed payload. Commonly used symbols may be replaced with shorter representations and less commonly used symbols may be replaced with longer representations. The Huffman coder may correspondingly output compressed data 814.

Figure 9:
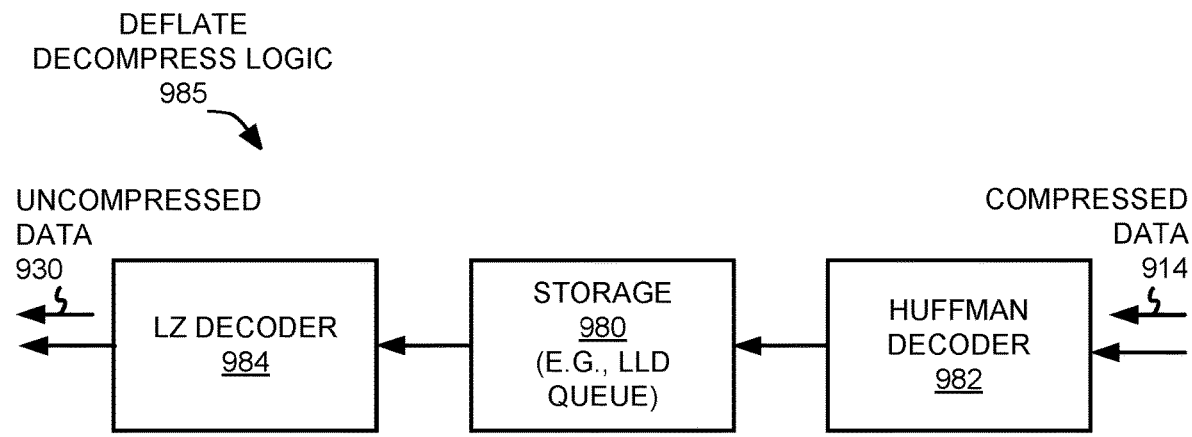
FIG. 9 is a block diagram of an example embodiment of Deflate decompress logic to decompress compressed data according to a Deflate approach.

FIG. 9 is a block diagram of an example embodiment of Deflate decompress logic 985 to decompress compressed data according to a Deflate approach. In some embodiments, the Deflate decompress logic may optionally be included in the second lossless data decompressor stage 124 of FIG. 1 and/or the 424 of FIG. 4, although the scope of the invention is not so limited.

The Deflate decompress logic includes a Huffman decoder 982 coupled to receive compressed data, a storage 980 e.g., LLD queue), and an LZ decoder 984. The Deflate decompress logic may perform a substantial reversal of the operations performed by the Deflate compress logic 878. The compressed data may be decoded in the Huffman decoder to construct a stream of symbols or other output to be used by the LZ77 decoder. These symbols or output may be queued or otherwise stored in the storage 980. Then, the LZ77 decoder may operate using this symbol stream to reconstruct the original data without needing hashing or hash tables.

Like Deflate, most other LZ-based approaches include two parts, namely an initial matching portion that finds matches and generates tokens (e.g., a stream of literal/length/distance), followed by a back-end encoding portion that encodes these tokens in some concrete, well defined, or standardized data format. In the case of Deflate, the encoding portion uses Huffman Codes. In the case of Zstandard, the encoding portion uses a variation of arithmetic encoding. In the case of LZ4, the encoding portion uses a simple byte-based encoding. Typically, there is no concrete, well defined, or standardized data format for the data passed from the initial matching portion to the back-end encoding portion. Consequently, stopping after the initial matching portion without performing the back-end encoding portion produces an ambiguous data stream not processable by public or standardized approaches, and so it is typically not done.

VII. Two Stage Compression Invoked by Instructions or Commands

In some embodiments, the two-stage lossless data compressors or the two-stage lossless data decompressors disclosed herein may be controlled by and/or may be responsive to a single machine language instruction, command (e.g., API command), or other control primitive, which may cause or control the compressors or decompressors to perform an indicated compression or decompression. The instruction, command, or other primitive may specify (e.g., explicitly specify) or otherwise indicate (e.g., implicitly indicate) information about the operation to be performed and the data or operands on which the operation is to be performed. Indicating the operation to be performed may include indicating whether the operation is compression or decompression, whether two approaches or one are to be used, and what the approach or approaches are. In some cases, part or all of the operation to be performed may be implicit to an opcode or other operation identifier of the primitive. In other cases, the primitive may have one or more fields to flexibly specify part or all of the operation. The information about the data or operands on which the operation is to be performed may include the start of the data to be compressed or decompressed (e.g., an address in memory), the end of the data (e.g., an address) or a length of the data (e.g., a number of bytes). In some cases, the information may be specified by control parameters in an operand or control structure of the primitive, such as, for example, as a descriptor stored in a Memory-mapped input/output (MMIO) control register(s) of the primitive. By way of example, software may program the descriptor or other parameters of the operation to be performed (e.g., in the MMIO control register(s), and then submit an API command or other control primitive to cause the compressor and/or decompressor to access the descriptor or other parameters and perform the indicated compression and/or decompression operation.

In some embodiments, at least one instruction, command, or other control primitive may indicate that compression is to be performed using a combination of two different compression algorithms or other approaches (e.g., zero compress then Deflate). In some embodiments, at least one such instruction, command, or other control primitive may indicate that decompression is to be performed using a combination of two different decompression algorithms or other approaches (e.g., Deflate the zero compress). In some embodiments, multiple instructions, commands, or other control primitives may optionally be included, and each may indicate that compression is to be performed using a combination of two different compression algorithms or other approaches (e.g., one API command indicating zero compress then Deflate, another API command indicating RLE then Deflate, yet another API command indicating zero compress then Broth, a further API command indicating RLE then LZO). In some embodiments, multiple instructions, commands, or other control primitives may optionally be included, and each may indicate that decompression is to be performed using a combination of two different decompression algorithms or other approaches (e.g., one API command indicating Deflate then zero compress, another API command indicating Deflate then RLE, yet another API command indicating Broth then zero compress, a further API command indicating LZO then RLE). In some embodiments, the compression or decompression using the two different approaches may be controlled, caused, or achieved through the single instruction, command, or control primitive (i.e., rather than two), and without needing to transfer intermediate results to memory causing extra memory bandwidth. One example of a suitable API is the Intel® Quick-Assist Technology (Intel® QAT) API, although the scope of the invention is not so limited.

Figure 10:
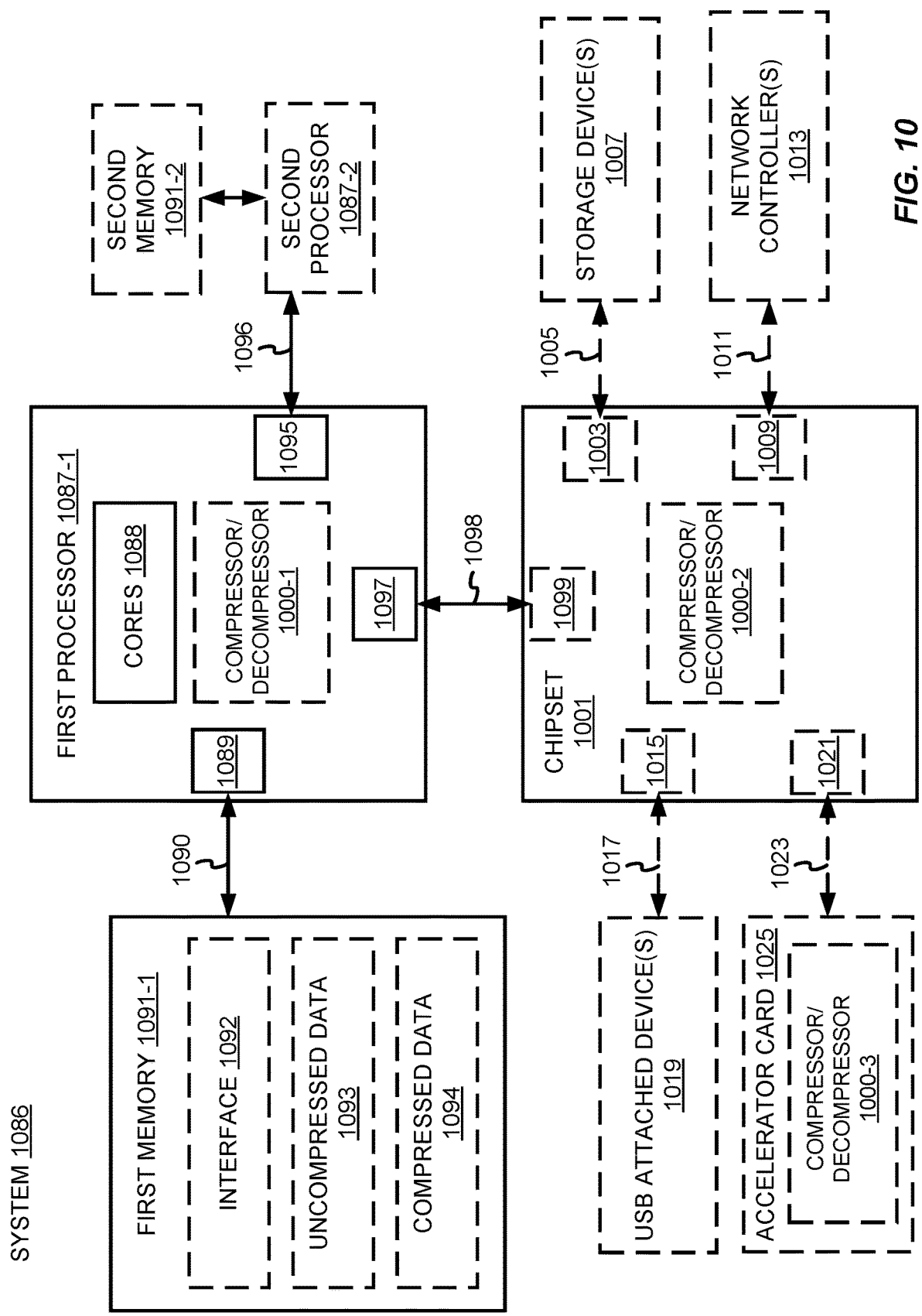
FIG. 10 is a block diagram of an example system in which an embodiment of a compressor and/or decompressor may optionally be employed.

VIII. Example Systems in which Compressors and/or Decompressors May be Employed FIG. 10 is a block diagram of an example system in which an embodiment of a compressor and/or decompressor may optionally be employed. In some embodiments, the system may represent a server computer system. It is to be appreciated that this is just one illustrative example of a suitable system. Other systems having different devices, different configurations, different standards, protocols, or technologies, and the like, are also suitable.

The system 1086 includes a first processor 1087-1. The first processor includes a plurality of cores 1088, such as, for example, general-purpose central processing unit (CPU) cores. In some embodiments, the first processor may optionally include an embodiment of a compressor and/or decompressor 1000-1 as disclosed elsewhere herein. In some embodiments, the compressor and/or decompressor may be implemented as an accelerator core in a tile with the general-purpose CPU cores, although the scope of the invention is not so limited. Placing the accelerator closer to the cores may help to increase the speed at which the cores may submit jobs to the accelerator core.

In some embodiments, the system may optionally include a second processor 1087-2. The first and second processors may be coupled through an interconnect or link 1096. The first processor may include an interconnect or link endpoint circuit 1095 to interface or coupled with the interconnect or link. In some embodiments, the interconnect or link may be a point-to-point interconnect or link. Suitable interconnects or links include, but are not limited to, Intel® Ultra Path Interconnect (UPI), Intel® QuickPath Technology with Intel® QuickPath Interconnect (QPI), and the like. In such cases, the endpoint circuit 1095 may be a point-to-point interconnect interface circuit.

The first processor 1087-1 may be coupled with a first memory 1091-1 over an interconnect or link 1090. The first processor may include an interconnect or link endpoint circuit 1089 to interface or coupled with the interconnect or link. The interface or link may provide one or more memory channels. The first processor may include an integrated memory controller to control access to the first memory. Likewise, if the second processor 1087-2 is included it may be coupled with an optional second memory 1091-2. The first and second memory may be portions of main memory locally attached to the first and second processors, respectively. Various types of memory are suitable, such as, for example, Double Data Rate 3 Synchronous Dynamic Random-Access Memory (DDR3 SDRAM), DDR4 SDRAM, DDR5 SDRAM, or other types of DRAM, flash memory, persistent memory, and the like. The first memory may be used to store compressed data 1094 and uncompressed data 1093 that are respectively compressed and uncompressed by one or more compressor(s) and/or decompressor(s) employed in the system. In some embodiments, the first memory may also be used to store an interface 1092 to communicate with the compressor(s) and/or decompressor(s) in the system. By way of example, the interface may be a Memory-mapped input/output (MMIO) region having one or more control and/or configuration registers to store a descriptor or other data about the operation to be performed (e.g., the start of the data, the end of the data, etc.).

The first processor 1087-1 is coupled with a chipset 1001 by an interconnect or link 1098. In some embodiments, a compressor and/or decompressor 100-2 may optionally be included in the chipset. The first processor may exchange data with the chipset, and devices coupled with the chipset, via the interconnect or link 1098. The first processor may include an interconnect or link endpoint circuit 1097, and the chipset may include an interconnect or link endpoint circuit 1099, to interface or coupled with the interconnect or link 1098. In some embodiments, the interconnect or link 1098 may be a point-to-point interconnect or link. Suitable interconnects or links include, but are not limited to, Peripheral Component Interconnect Express (PCIe) and Direct Media Interface (DMI) interconnects or links, and the like, and combinations thereof. PCIe generally represents a type of high-speed serial computer expansion bus. If PCIe is included, the first processor and the chipset may each include a PCIe bus controller, where the PCIe may be based on the current version of the standard, or any legacy version, as desired for the implementation.

In various embodiments, the chipset 1001 may optionally support various additional interconnects or links (e.g., 1005, 1011, 1017, 1023) to allow various other types of devices to be coupled with the system, although the scope of the invention is not limited to any known number or type of such interconnects or links or any known types of devices. In the illustrated embodiment, the chipset is optionally coupled with one or more storage devices 1007 (e.g., one or more disk drives or other mass storage devices) by an optional first interconnect or link 1005. The chipset may include an optional interconnect or link endpoint circuit 1003 to interface or coupled with the first interconnect or link 1005. Examples of suitable links include, but are not limited to, SATA (Serial Advanced Technology Attachment). The chipset is optionally coupled with one or more network controllers 1013 (e.g., one or more Ethernet controllers, media access control (MAC)) by an optional second interconnect or link 1011. The chipset may include an optional interconnect or link endpoint circuit 1009 to interface or coupled with the second interconnect or link 1009. Examples of suitable links include, but are not limited to, PCIe based on the current version of the standard, or any legacy version, as desired for the implementation. The chipset is optionally coupled with one or more Universal Serial Bus (USB) devices 1019 by an optional third USB bus or link 1015. The USB bus or link may be based on the current version of the standard, or any legacy version, as desired for the implementation. The chipset may include an optional USB bus or link endpoint circuit 1015 to interface or coupled with the third USB bus or link 1017. Examples of suitable USB devices include, but are not limited to, human/user interface devices, a front panel device, a baseboard management controller (BMC), and USB mass storage devices, to name a few examples.

The chipset is optionally coupled with an accelerator card 1025 by an optional fourth interconnect or link 1023. The chipset may include an optional interconnect or link endpoint circuit 1021 to interface or coupled with the fourth interconnect or link 1023. Examples of suitable links include, but are not limited to, PCIe based on the current version of the standard, or any legacy version, as desired for the implementation. In some embodiments, the accelerator card may optionally include a compressor and/or decompressor 1000-3. If desired, other devices may also optionally be coupled with the chipset, such as, for example, a coprocessor, graphics accelerator, digital signal processor (DSP), general-purpose graphics processing unit (GPGPU), field programmable gate array, or the like.

One potential use of the compressors and decompressors disclosed herein is to implement a memory tier scheme through compression and decompression, although the scope of the invention is not so limited. Main memory may be divided into a compressed portion used to store compressed memory pages, and an uncompressed portion used to store uncompressed memory pages. System software (e.g., an operating system or virtual machine monitor) may track use of memory pages to determine whether they have high, medium, or low relative levels of use. The high, medium, and low use pages may be referred to as hot, warm, or cold pages, respectively. The system software may maintain hot pages in the uncompressed portion of the main memory, the warm pages in the compressed portion of the main memory, and the cold pages in secondary backing storage. Rather than immediately paging out hot pages directly out to the secondary backing storage when they are used less frequently and transition to warm, the system software may instead submit a job to a compressor to have the page compressed and stored in the compressed portion of main memory. When software accesses a page that was warm, it results in a page fault, and the system software recognizes that a compressed version exists in the compressed portion of main memory. It may then submit a job to a decompressor to decompress the page. The latency of accessing and decompressing the warm pages from the compressed portion of memory may be less than that of accessing the pages from the secondary backing storage. Such a memory tier scheme may help to increase the effective memory capacity (e.g., allowing more pages to be stored in the main memory through the compression), while maintaining the speed of accessing these pages greater than if the warm pages were paged out to the secondary backing storage. In such implementations, it may be generally advantageous or at least useful to be able to decrease the compression latency and/or the decompression latency using the approaches disclosed herein. However, the scope of the invention is not limited to such uses of the compressors and/or decompressors.

Figure 11:
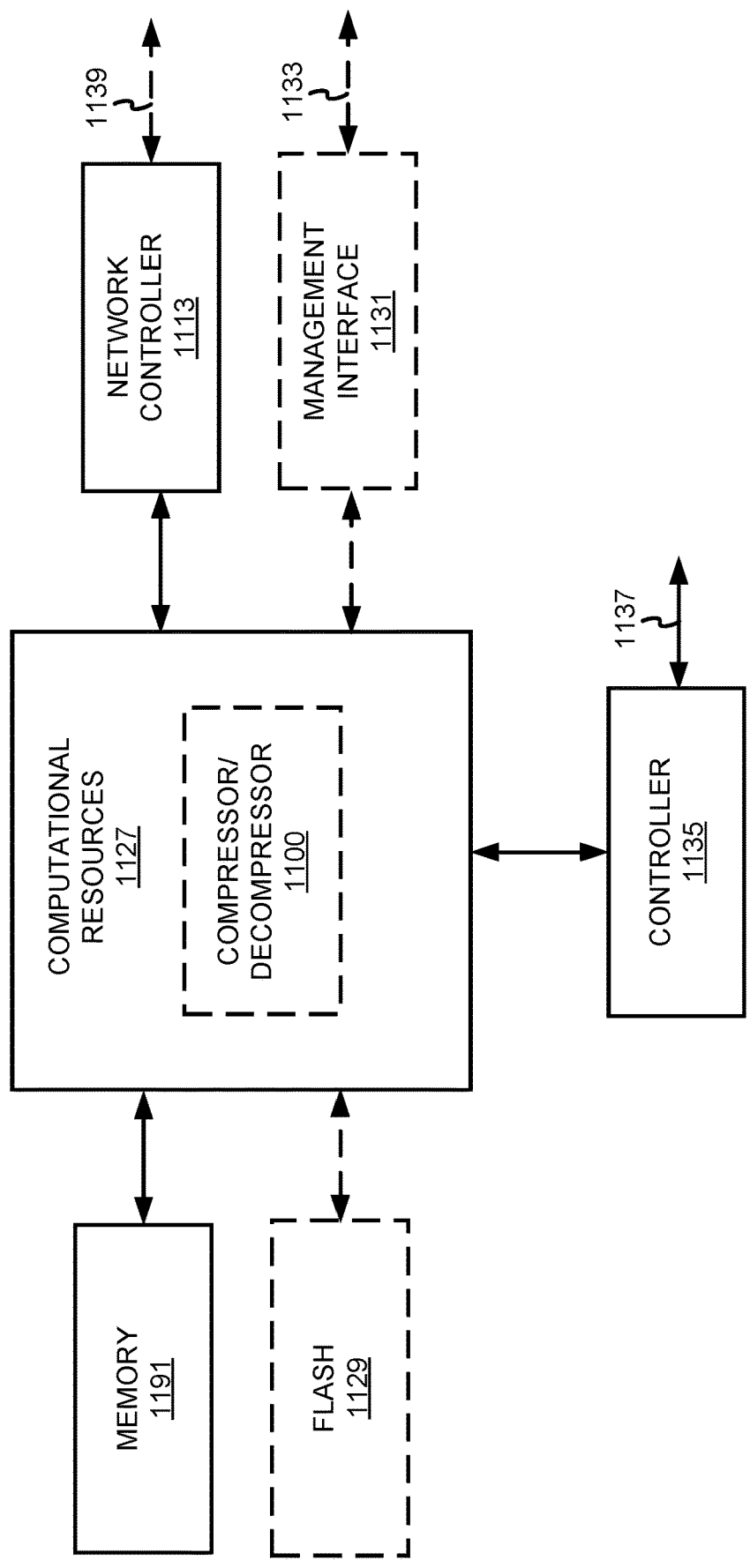
FIG. 11 is a block diagram of an example accelerator card in which an embodiment of a compressor and/or decompressor may optionally be employed.

FIG. 11 is a block diagram of an example accelerator card 1125 in which an embodiment of a compressor and/or decompressor 1100 may optionally be employed. The card includes a controller 1135 to control access to and/or couple the card to a server or other system via an interconnect or other link 1137. In some embodiments, the controller may be a PCI or PCIe controller to control access to and/or couple the card to a PCI or PCIe interconnect or other link, respectively.

The card includes computational resources 1127 to perform computations on data to help accelerate operations associated with the server or other system in which the card is deployed. Examples of suitable computational resources include, but are not limited to, one or more general-purpose processors, non-general-purpose and/or special-purpose processors (e.g., field-programmable gate arrays (FPGAs), graphics processing units (GPUs) (e.g., general-purpose GPUs), application-specific integrated circuits (ASICs), and various combinations thereof. In some embodiments, the computational resources may include an embodiment of a compressor and/or decompressor 1100 as described elsewhere herein.

In some embodiments, the computational resources may include the compressor and/or decompressor 1100. In some embodiments, the compressor and/or decompressor may be accessed through an API interface, as described elsewhere herein, although the scope of the invention is not so limited. The computational resources may also optionally include acceleration logic, such as, for example, cryptography, packet processing, machine learning, genomics, or the like.

The card also includes memory 1191 (e.g., DDR4 or other forms of DRAM) to store data (e.g., compressed data, uncompressed data, etc.). The card may also optionally include a flash memory 1129.

The card also includes at least one network controller 1113 to control access to and/or couple the card with a network via an interconnect or other link 1139. Examples of suitable network controllers include, but are not limited to, Ethernet controllers and controllers for Quad (4 channel)

Small Form Factor Pluggable (QSFP) transceivers, for example QSFP+ transceivers.

The card also optionally includes a management interface 1131 to allow monitoring and management of the card via an interconnect or other link 1133. An example of a suitable management interface is a baseboard management controller (BMC) coupled by a communication link, such as, for example, a USB controller, port, and link.

IX. General Matters

Components, features, and details described for any of the disclosed compressors (e.g., 106, 406, 506) and decompressors (e.g., 122, 422) may optionally apply to any of the disclosed compression methods (e.g., 201) and decompression (e.g., 303), respectively, which in embodiments may optionally be performed by and/or with such compressors and decompressors. Any of the disclosed compressors and decompressors (e.g., 106, 406, 506, 122, 422) in embodiments may optionally be included in any of the disclosed systems (e.g., any of the systems of FIGS. 10-11).

Processor components disclosed herein may be said and/or claimed to be operative, operable, capable, able, configured, adapted, or otherwise to perform an operation. For example, a compressor or decompressor may be said and/or claimed to compress or decompress data, respectively. As used herein, these expressions refer to the characteristics, properties, or attributes of the compressors and decompressors when in a powered-off state, and do not imply that the apparatus having the compressor or decompressor is currently operating or powered on. For clarity, it is to be understood that the apparatus claimed herein are not claimed as being operating or powered on.

As used herein, the term "and/or" means one or the other or both (e.g., A and/or B means A or B or both A and B).

In the description and claims, the terms "coupled" and/or "connected," along with their derivatives, may have be used. These terms are not intended as synonyms for each other. Rather, in embodiments, "connected" may be used to indicate that two or more elements are in direct physical and/or electrical contact with each other. "Coupled" may mean that two or more elements are in direct physical and/or electrical contact with each other. However, "coupled" may also mean that two or more elements are not in direct contact with each other, yet still co-operate or interact with each other. For example, a first compressor stage may be coupled with a second compressor stage by an optional intervening component (e.g., a queue or other storage). In the figures, arrows are used to show connections and couplings.

In the description above, specific details have been set forth in order to provide a thorough understanding of the embodiments. However, other embodiments may be practiced without some of these specific details. The scope of the invention is not to be determined by the specific examples provided above, but only by the claims below. In other instances, well-known circuits, structures, devices, and operations have been shown in block diagram form and/or without detail in order to avoid obscuring the understanding of the description. Where considered appropriate, reference numerals, or the last two digits of reference numerals, have been repeated among the figures to indicate corresponding or analogous elements, which may optionally have similar or the same characteristics, unless specified or clearly apparent otherwise.

Certain operations may be performed by hardware components, or may be embodied in machine-executable or circuit-executable instructions, that may be used to cause and/or result in a machine, circuit, or hardware component programmed with the instructions performing the operations. The operations may also optionally be performed by a combination of hardware, firmware, and/or software. A processor, machine, circuit, or hardware may include specific or particular circuitry or other logic (e.g., hardware potentially combined with firmware and/or software) is operative to execute and/or process the instruction and store a result in response to the instruction.

Some embodiments include an article of manufacture (e.g., a computer program product) that includes a machine-readable storage medium that stores information in a form that is readable by a machine. The machine-readable medium may have stored thereon a sequence of instructions that if and/or when executed by the machine are operative to cause the machine to perform and/or result in the machine performing one or operations, methods, or techniques disclosed herein. In some embodiments, the machine-readable medium may include a tangible and/or non-transitory machine-readable storage medium that does not consist of a transitory propagated signal. For example, the non-transitory machine-readable storage medium may include an optical data storage device, a magnetic disk, a magneto-optical disk, a read only memory (ROM), a random access memory (RAM), a Flash memory, or the like.

Reference throughout this specification to "one embodiment," "an embodiment," "one or more embodiments," "some embodiments," for example, indicates that a particular feature may be included in the practice of the invention but is not necessarily required to be. Similarly, in the description various features are sometimes grouped together in a single embodiment, Figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects lie in less than all features of a single disclosed embodiment. Thus, the claims following the Detailed Description are hereby expressly incorporated into this Detailed Description, with each claim standing on its own as a separate embodiment of the invention.

X. Example Embodiments

The following examples pertain to further embodiments. Specifics in the examples may be used anywhere in one or more embodiments.

Example 1 is a processor, SoC, system, accelerator card, or other apparatus that includes a first lossless data compressor stage (or circuitry) coupled to receive input data. The first lossless data compressor stage (or circuitry) is to apply a first lossless data compression approach to compress the input data to generate intermediate compressed data. The apparatus also includes a second lossless data compressor stage (or circuitry) coupled with the first lossless data compressor stage (or circuitry) to receive the intermediate compressed data. The second lossless data compressor stage (or circuitry) is to apply a second lossless data compression approach to compress at least some of the intermediate compressed data to generate compressed data. The second lossless data compression approach is different than the first lossless data compression approach.

Example 2 includes the apparatus of example 1, where a compression speed of the first lossless data compression approach per unit amount of the input data is faster than the compression speed of the second lossless data compression approach per unit amount of the input data.

Example 3 includes the apparatus of any one of examples 1 and 2, where the second lossless data compression approach is a dictionary coder based approach, and optionally where the first lossless data compression approach is not a dictionary coder based approach.

Example 4 includes the apparatus of any one of examples 1 to 3, where the first lossless data compression approach is that is one of zero compress approach, a run length encoding (RLE) approach, a frequent pattern compression (FPC) approach, and a Wilson-Kaplan direct-mapped (WKdm) approach.

Example 5 includes the apparatus of any one of examples 1 to 4, where the second lossless data compression approach is that is one of a Deflate approach, a Broth approach, a Zstandard approach, a bzip2 approach, a Lempel-Ziv (LZ) approach, an LZ77 approach, an LZ78 approach, a Lempel-Ziv-Welch (LZW) approach, a Lempel-Ziv-Oberhumer (LZO) approach, and a Burrows-Wheeler transform approach.

Example 6 includes the apparatus of any one of examples 1 to 5, where the first lossless data compression approach is a zero compress approach, and optionally where the second lossless data compression approach is a Deflate approach.

Example 7 includes the apparatus of any one of examples 1 to 6, where the first lossless data compression approach is a zero compress approach, where the first compressor stage to apply the first lossless data compression approach to the input data is to generate a bitmask and a concatenated sequence of non-zero-valued elements in the input data, the bitmask to indicate which elements of the input data are zero-valued elements and which are the non-zero-valued elements, and where the second lossless data compressor stage is to apply the second lossless data compression approach to compress the concatenated sequence of the non-zero-valued elements but not the bitmask.

Example 8 includes the apparatus of any one of examples 1 to 6, where the first lossless data compression approach is a zero compress approach, where the first compressor stage to apply the first lossless data compression approach to the input data is to generate a bitmask and a concatenated sequence of non-zero-valued elements in the input data, the bitmask to indicate which elements of the input data are zero-valued elements and which are the non-zero-valued elements, and where the second lossless data compressor stage is to apply the second lossless data compression approach to compress both the bitmask and the concatenated sequence of the non-zero-valued elements.

Example 9 includes the apparatus of any one of examples 1 to 8, where the first lossless data compressor stage includes a first input structure coupled to receive the input data, a first circuitry coupled with the first input structure to receive the input data, the first circuitry to apply the first lossless data compression approach to the input data to generate the intermediate compressed data, and optionally a first output structure coupled with the first circuitry to output the intermediate compressed data.

Example 10 includes the apparatus of any one of examples 1 to 9, where the second lossless data compressor stage optionally includes a second input structure coupled with the first output structure to receive the intermediate compressed data, a second circuitry coupled with the second input structure to receive the intermediate compressed data, the second circuitry to apply the second lossless data compression approach to the intermediate compressed data to generate the compressed data, and a second output structure coupled with the second circuitry to output the compressed data.

Example 11 includes the apparatus of example 9, where the first lossless data compressor stage includes a third circuitry coupled with the first input structure. The third circuitry is to apply a third lossless data compression approach to compress data. The third lossless data compression approach is different than the first lossless data compression approach and the second lossless data compression approach.

Example 12 includes the apparatus of any one of examples 1 to 11, where the first lossless data compressor stage is operative to apply a third lossless data compression approach to additional data. The third lossless data compression approach is different than the first lossless data compression approach and the second lossless data compression approach.

Example 13 includes the apparatus of any one of examples 1 to 12, where the first lossless data compressor stage and the second lossless data compressor stage are part of a same lossless data compression pipeline.

Example 14 includes the apparatus of any one of examples 1 to 13, where the first lossless data compressor stage and the second lossless data compressor stage are to be controlled responsive to a single control primitive to apply the first lossless data compression approach and apply the second lossless data compression approach, respectively.

Example 15 includes the apparatus of any one of examples 1 to 14, further including a bypass around the first lossless data compressor stage.

Example 16 includes the apparatus of any one of examples 1 to 15, further including a storage coupled between the first lossless data compressor stage and the second lossless data compressor stage.

Example 17 includes the apparatus of any one of examples 1 to 16, further including a two-stage lossless data decompressor. The two-stage lossless data decompressor including a first lossless data decompressor stage coupled to receive compressed data. The first lossless data compressor stage is to apply a first lossless data decompression approach to decompress the compressed data to generate intermediate decompressed data. The two-stage lossless data decompressor also including a second lossless data decompressor stage coupled with the first lossless data decompressor stage to receive the intermediate decompressed data. The second lossless data decompressor stage is to apply a second lossless data decompression approach to decompress the intermediate decompressed data to generate decompressed data. The second lossless data decompression approach is different than the first lossless data decompression approach.

Example 18 is a method that includes receiving input data at a two-stage lossless data compressor of an integrated circuit. The method also includes applying a first lossless data compression approach, with the two-stage lossless data compressor, to compress the input data to generate intermediate compressed data. The method also includes applying a second lossless data compression approach, with the two-stage lossless data compressor, to compress at least some of the intermediate compressed data to generate compressed data, without the intermediate compressed data leaving the two-stage lossless data compressor. The second lossless data compression approach is different than the first lossless data compression approach.

Example 19 includes the method of example 18, where the application of the first lossless data compression approach is faster per unit amount of the input data than applying the second lossless data compression approach per unit amount of the input data.

Example 20 includes the method of any one of examples 18 to 19, where the application of the first lossless data compression approach includes applying an approach that is one of zero compress approach, a run length encoding (RLE) approach, a frequent pattern compression (FPC) approach, and a Wilson-Kaplan direct-mapped (WKdm) approach. Also, optionally where the application of the second lossless data compression approach includes applying an approach that is one of a Deflate approach, a Broth approach, a Zstandard approach, a bzip2 approach, a Lempel-Ziv (LZ) approach, an LZ77 approach, an LZ78 approach, a Lempel-Ziv-Welch (LZW) approach, a Lempel-Ziv-Oberhumer (LZO) approach, and a Burrows-Wheeler transform approach.

Example 21 is a system that includes a two-stage lossless data compressor, including a first lossless data compressor stage coupled to receive data. The first lossless data compressor stage is to apply a first lossless data compression approach to compress the data to generate intermediate compressed data. The two-stage lossless data compressor also includes a second lossless data compressor stage coupled with the first lossless data compressor stage to receive the intermediate compressed data. The second lossless data compressor stage is to apply a second lossless data compression approach to compress at least some of the intermediate compressed data to generate compressed data. The second lossless data compression approach is different than the first lossless data compression approach. The system also optionally includes a dynamic random access memory (DRAM) coupled with the two-stage lossless data compressor. The DRAM is to store the data and the compressed data.

Example 22 includes the system of example 21, where a compression speed of the first lossless data compression approach per unit amount of the received data is faster than the compression speed of the second lossless data compression approach per unit amount of the received data.

Example 23 is a processor, SoC, system, accelerator card, or other apparatus that includes a first lossless data decompressor stage coupled to receive compressed data. The first lossless data decompressor stage is to apply a first lossless data decompression approach to decompress the compressed data to generate intermediate decompressed data. The apparatus also includes a second lossless data decompressor stage coupled with the first lossless data decompressor stage to receive the intermediate decompressed data. The second lossless data decompressor stage is to apply a second lossless data decompression approach to decompress at least some of the intermediate compressed data to generate uncompressed data. The second lossless data decompression approach is different than the first lossless data decompression approach.

Example 24 is a method that includes receiving compressed data at a two-stage lossless data decompressor of an integrated circuit. The method also includes applying a first lossless data decompression approach, with the two-stage lossless data decompressor, to decompress the input data to generate intermediate decompressed data. The method also includes applying a second lossless data compression approach, with the two-stage lossless data compressor, to decompress at least some of the intermediate decompressed data to generate decompressed data, without the intermediate decompressed data leaving the two-stage lossless data decompressor. The second lossless data decompression approach is different than the first lossless data decompression approach.

Example 25 is a processor, SoC, system, accelerator card, or other apparatus that includes a first means for applying a first lossless data compression approach to compress input data to generate intermediate compressed data. The apparatus also includes a second means for applying a second lossless data compression approach to compress at least some of the intermediate compressed data to generate compressed data. The second lossless data compression approach is different than the first lossless data compression approach.

Example 26 is an apparatus operative to perform the method of any one of Examples 18 to 19.

Example 27 is an apparatus that includes means for performing the method of any one of Examples 18 to 19.

Example 28 is an apparatus that includes any combination of modules and/or units and/or logic and/or circuitry and/or means operative to perform the method of any one of Examples 18 to 19.

Example 29 is an apparatus substantially as described herein.

Example 30 is an apparatus that is operative to perform any method substantially as described herein.

Example 31 is an apparatus including control logic to receive a control primitive indicating input data in system memory and indicating that two-stage lossless data compression is to be performed. The apparatus also includes a two-stage lossless data compressor coupled with the control logic. The two-stage lossless data compressor to be controlled by the control logic to perform the two-stage lossless data compression. The two-stage lossless data compressor includes a first lossless data compressor stage coupled to receive the input data. The first lossless data compressor stage to apply a first lossless data compression approach to compress the input data to generate intermediate compressed data. The two-stage lossless data compressor also includes a second lossless data compressor stage coupled with the first lossless data compressor stage to receive the intermediate compressed data, the second lossless data compressor stage to apply a second lossless data compression approach to compress at least some of the intermediate compressed data to generate compressed data, the second lossless data compression approach different than the first lossless data compression approach.

Example 32 includes Example 31 optionally in which a compression speed of the first lossless data compression approach per unit amount of the input data is faster than the compression speed of the second lossless data compression approach per unit amount of the input data, and optionally in which the two-stage lossless data compressor is to be controlled by the control logic according to the control primitive to store the compressed data back to the system memory.

Example 33 includes Example 31 or Example 32 optionally in which the first lossless data compression approach is a zero compress approach, and optionally in which the second lossless data compression approach is a Deflate approach.

What is claimed is:

1. An apparatus comprising:
   a first lossless data compressor circuitry coupled to receive input data, the first lossless data compressor circuitry to apply a first lossless data compression approach to compress the input data to generate intermediate compressed data; and a second lossless data compressor circuitry coupled with the first lossless data compressor circuitry to receive the intermediate compressed data, the second lossless data compressor circuitry to apply a second lossless data compression approach to compress at least some of the intermediate compressed data to generate compressed data, the second lossless data compression approach different than the first lossless data compression approach, wherein the second lossless data compression approach includes a first part and a second part, the first part to identify strings and matching strings in the intermediate compressed data, and to replace the matching strings with distances to the matching strings and lengths of the matching strings, the second part to encode the distances and lengths as part of generating the compressed data.

2. The apparatus of claim 1, wherein a compression speed of the first lossless data compression approach per unit amount of the input data is faster than the compression speed of the second lossless data compression approach per unit amount of the input data.

3. The apparatus of claim 2, wherein the second lossless data compression approach is a dictionary coder based approach, and the first lossless data compression approach is not a dictionary coder based approach.

4. The apparatus of claim 1, wherein the first lossless data compression approach is selected from group consisting of zero compress approach, a run length encoding (RLE) approach, a frequent pattern compression (FPC) approach, and a Wilson-Kaplan direct-mapped (WKdm) approach.

5. The apparatus of claim 4, wherein the second lossless data compression approach is a Deflate approach.

6. The apparatus of claim 5, wherein the first lossless data compression approach is a zero compress approach.

7. An apparatus comprising:
a first lossless data compressor circuitry coupled to receive input data, the first lossless data compressor circuitry to apply a first lossless data compression approach to compress the input data to generate intermediate compressed data, wherein the first lossless data compression approach is a zero compress approach, wherein the first lossless data compressor circuitry to apply the first lossless data compression approach to the input data is to generate a bitmask and a concatenated sequence of non-zero-valued elements in the input data, the bitmask to indicate which elements of the input data are zero-valued elements and which are the non-zero-valued elements; and
a second lossless data compressor circuitry coupled with the first lossless data compressor circuitry to receive the intermediate compressed data, the second lossless data compressor circuitry to apply a second lossless data compression approach to compress at least some of the intermediate compressed data to generate compressed data, the second lossless data compression approach different than the first lossless data compression approach, wherein the second lossless data compressor circuitry is to apply the second lossless data compression approach to compress the concatenated sequence of the non-zero-valued elements but not the bitmask.

8. An apparatus comprising:
a first lossless data compressor circuitry coupled to receive input data, the first lossless data compressor circuitry to apply a first lossless data compression approach to compress the input data to generate intermediate compressed data, wherein the first lossless data compression approach is a zero compress approach, wherein the first lossless data compressor circuitry to apply the first lossless data compression approach to the input data is to generate a bitmask and a concatenated sequence of non-zero-valued elements in the input data, the bitmask to indicate which elements of the input data are zero-valued elements and which are the non-zero-valued elements; and
a second lossless data compressor circuitry coupled with the first lossless data compressor circuitry to receive the intermediate compressed data, the second lossless data compressor circuitry to apply a second lossless data compression approach to compress at least some of the intermediate compressed data to generate compressed data, the second lossless data compression approach different than the first lossless data compression approach, wherein the second lossless data compressor circuitry is to apply the second lossless data compression approach to compress both the bitmask and the concatenated sequence of the non-zero-valued elements.

9. The apparatus of claim 1, wherein the first lossless data compressor circuitry comprises:
a first input structure coupled to receive the input data;
a first circuitry coupled with the first input structure to receive the input data, the first circuitry to apply the first lossless data compression approach to the input data to generate the intermediate compressed data; and
a first output structure coupled with the first circuitry to output the intermediate compressed data.

10. The apparatus of claim 9, wherein the second lossless data compressor circuitry comprises:
a second input structure coupled with the first output structure to receive the intermediate compressed data;
a second circuitry coupled with the second input structure to receive the intermediate compressed data, the second circuitry to apply the second lossless data compression approach to the intermediate compressed data to generate the compressed data; and
a second output structure coupled with the second circuitry to output the compressed data.

11. The apparatus of claim 10, wherein the first lossless data compressor circuitry comprises:
a third circuitry coupled with the first input structure, the third circuitry to apply a third lossless data compression approach to compress data, the third lossless data compression approach different than the first lossless data compression approach.

12. An apparatus comprising:
a first lossless data compressor circuitry coupled to receive input data, the first lossless data compressor circuitry to apply a first lossless data compression approach to compress the input data to generate intermediate compressed data, wherein the first lossless data compressor circuitry is operative to apply a third lossless data compression approach to additional data, the third lossless data compression approach different than the first lossless data compression approach; and
a second lossless data compressor circuitry coupled with the first lossless data compressor circuitry to receive the intermediate compressed data, the second lossless data compressor circuitry to apply a second lossless data compression approach to compress at least some of the intermediate compressed data to generate compressed data, the second lossless data compression approach different than the first lossless data compression approach.

13. The apparatus of claim 1, wherein the first lossless data compressor circuitry and the second lossless data compressor circuitry are part of a same lossless data compression pipeline.

14. The apparatus of claim 1, wherein the first lossless data compressor circuitry and the second lossless data compressor circuitry are to be controlled responsive to a single control primitive to said apply the first lossless data compression approach and said apply the second lossless data compression approach, respectively.

15. The apparatus of claim 1, further comprising a bypass around the first lossless data compressor circuitry.

16. The apparatus of claim 1, further comprising a storage coupled between the first lossless data compressor circuitry and the second lossless data compressor circuitry.

17. The apparatus of claim 1, further comprising:
a lossless data decompressor comprising:
a first lossless data decompressor circuitry coupled to receive compressed data, the first lossless data compressor circuitry to apply a first lossless data decompression approach to decompress the compressed data to generate intermediate decompressed data; and
a second lossless data decompressor circuitry coupled with the first lossless data decompressor circuitry to receive the intermediate decompressed data, the second lossless data decompressor circuitry to apply a second lossless data decompression approach to decompress the intermediate decompressed data to generate decompressed data, the second lossless data decompression approach different than the first lossless data decompression approach.

* * * * *